US011239117B1

(12) United States Patent
Saeedi Vahdat et al.

(10) Patent No.: US 11,239,117 B1
(45) Date of Patent: Feb. 1, 2022

(54) REPLACEMENT GATE DIELECTRIC IN THREE-NODE ACCESS DEVICE FORMATION FOR VERTICAL THREE DIMENSIONAL (3D) MEMORY

(71) Applicant: Micron Technology, Inc., Boise, ID (US)

(72) Inventors: Armin Saeedi Vahdat, Boise, ID (US); John A. Smythe, III, Boise, ID (US); Si-Woo Lee, Boise, ID (US); Gurtej S. Sandhu, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/004,084

(22) Filed: Aug. 27, 2020

(51) Int. Cl.
 *H01L 21/8234* (2006.01)
 *H01L 21/822* (2006.01)
 (Continued)

(52) U.S. Cl.
 CPC .......... *H01L 21/8221* (2013.01); *G11C 5/063* (2013.01); *H01L 21/02532* (2013.01); *H01L 21/76802* (2013.01); *H01L 21/76877* (2013.01); *H01L 27/0688* (2013.01); *H01L 27/1085* (2013.01); *H01L 27/10808* (2013.01); *H01L 27/10885* (2013.01); *H01L 27/10891* (2013.01); *H01L 29/66545* (2013.01)

(58) Field of Classification Search
 CPC ......... H01L 29/66545; H01L 27/10885; H01L 27/10808; H01L 27/10891; H01L 27/1085; H01L 27/0688; H01L 27/10873; H01L 27/108; H01L 21/30604; H01L 21/31111; H01L 27/10844; H01L 21/02532; H01L 21/76802; H01L 21/76877; H01L 27/10847; H01L 21/8221
 See application file for complete search history.

(56) References Cited

U.S. PATENT DOCUMENTS 10,607,995 B2   3/2020   Roberts et al.
2017/0053906 A1*  2/2017  Or-Bach ........... H01L 27/11578
(Continued)

OTHER PUBLICATIONS

U.S. Appl. No. 16/204,224, entitled, "Memory Arrays," filed Nov. 29, 2018, 43 pages.

*Primary Examiner* — Shouxiang Hu
(74) *Attorney, Agent, or Firm* — Brooks, Cameron & Huebsch, PLLC

(57) ABSTRACT

Systems, methods, and apparatus are provided for storage node after horizontally oriented, three-node access device formation in vertical three dimensional (3D) memory. An example method includes a method for forming arrays of vertically stacked memory cells, having horizontally oriented access devices and vertically oriented access lines. The method includes depositing alternating layers of a dielectric material and a sacrificial semiconductor material to form a vertical stack. A first vertical opening is formed through the vertical stack to expose a first region of the sacrificial semiconductor material. The first region is selectively removed to form a first horizontal opening in which to replace a sacrificial gate dielectric material, form a source/drain conductive contact material, a channel conductive material, and a digit line conductive contact material of the three-node access device.

20 Claims, 34 Drawing Sheets

(51) Int. Cl.
    *H01L 29/66*     (2006.01)
    *H01L 27/108*     (2006.01)
    *G11C 5/06*     (2006.01)
    *H01L 21/768*     (2006.01)
    *H01L 21/02*     (2006.01)
    *H01L 27/06*     (2006.01)

(56) References Cited

U.S. PATENT DOCUMENTS

| | | |
|---|---|---|
| 2018/0323200 A1 | 11/2018 | Tang et al. |
| 2019/0103406 A1 | 4/2019 | Tang et al. |
| 2019/0164985 A1 | 5/2019 | Lee et al. |
| 2020/0227418 A1* | 7/2020 | Kim .................. H01L 27/10867 |
| 2020/0350315 A1* | 11/2020 | Son .................. H01L 27/10873 |
| 2021/0134800 A1* | 5/2021 | Park ..................... H01L 27/108 |

* cited by examiner

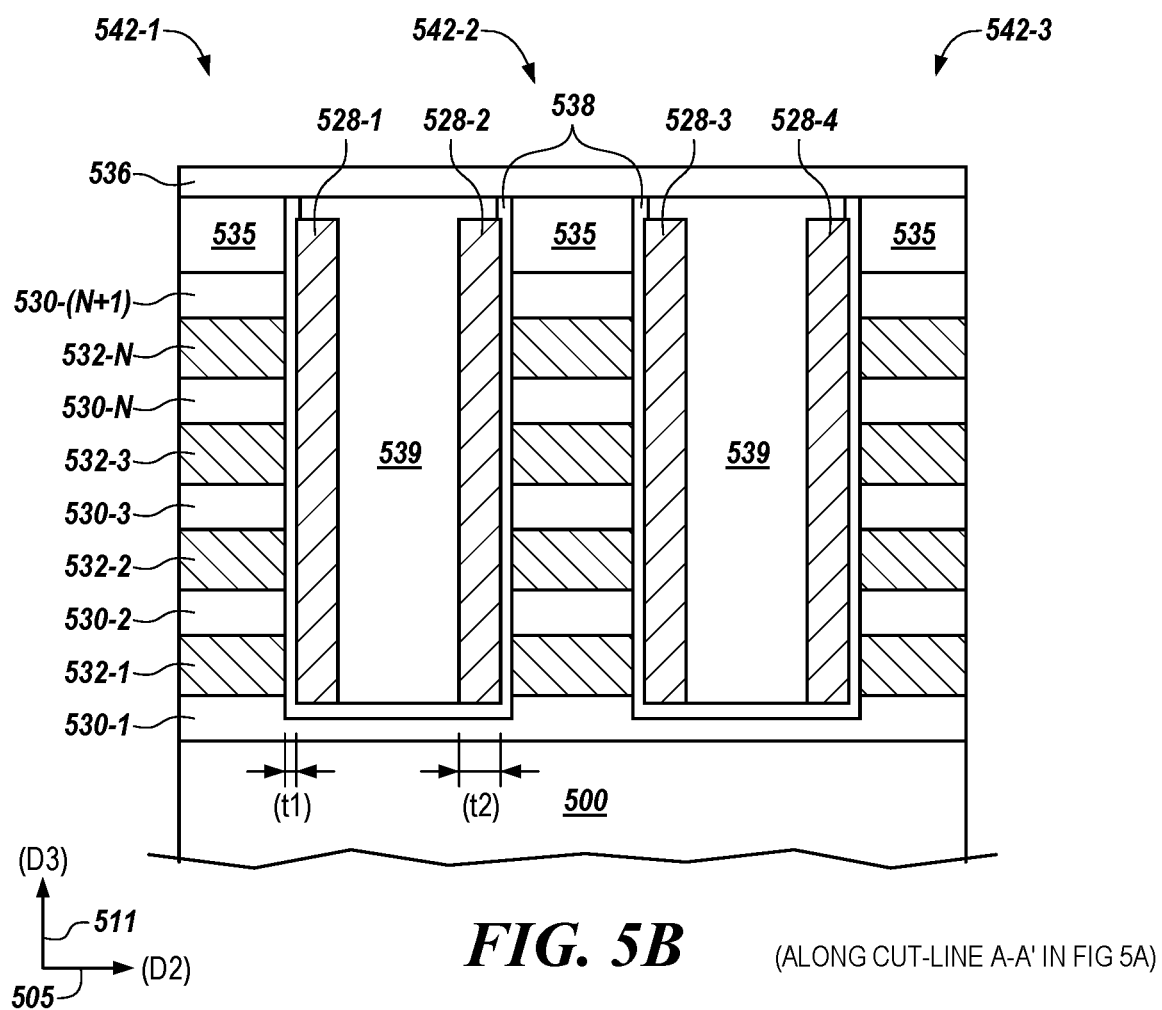
FIG. 5B (ALONG CUT-LINE A-A' IN FIG 5A)

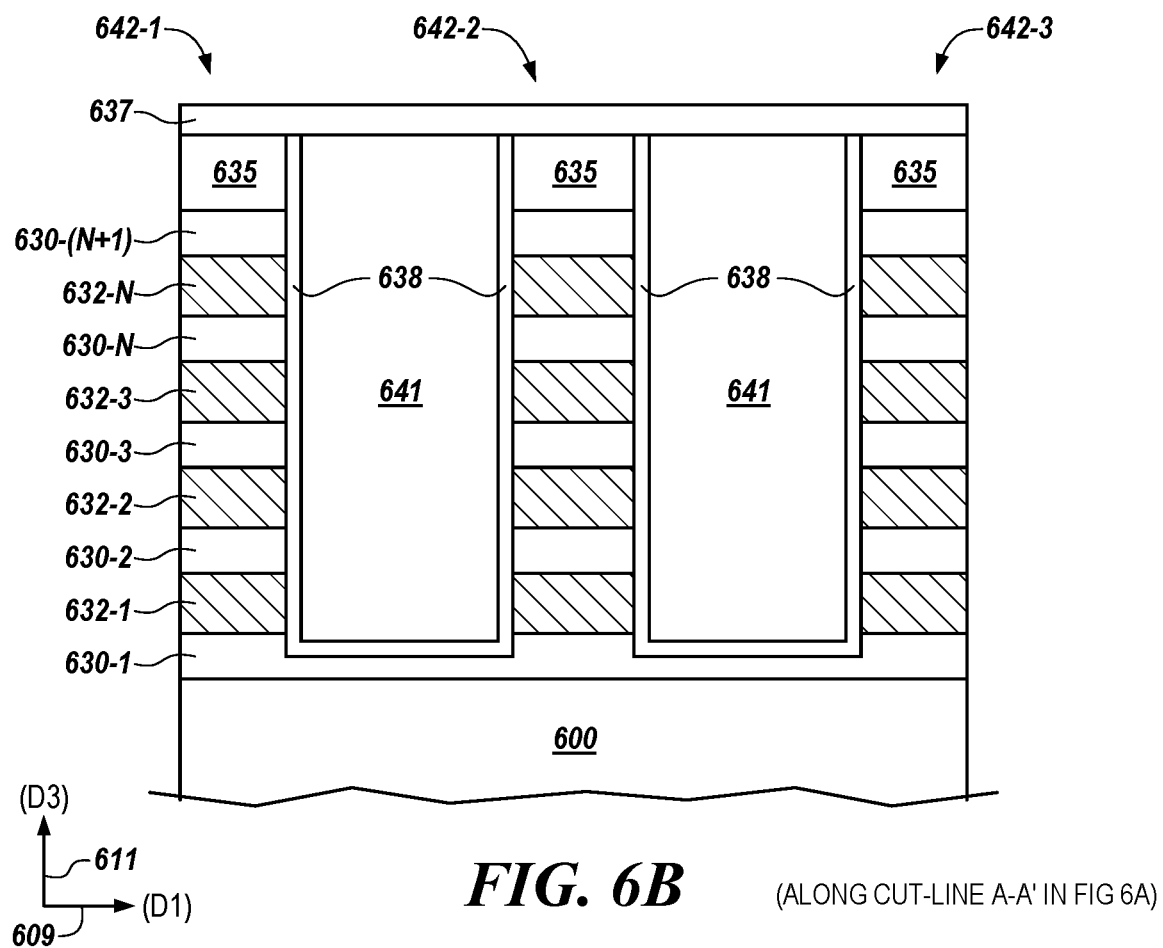
FIG. 6B (ALONG CUT-LINE A-A' IN FIG 6A)

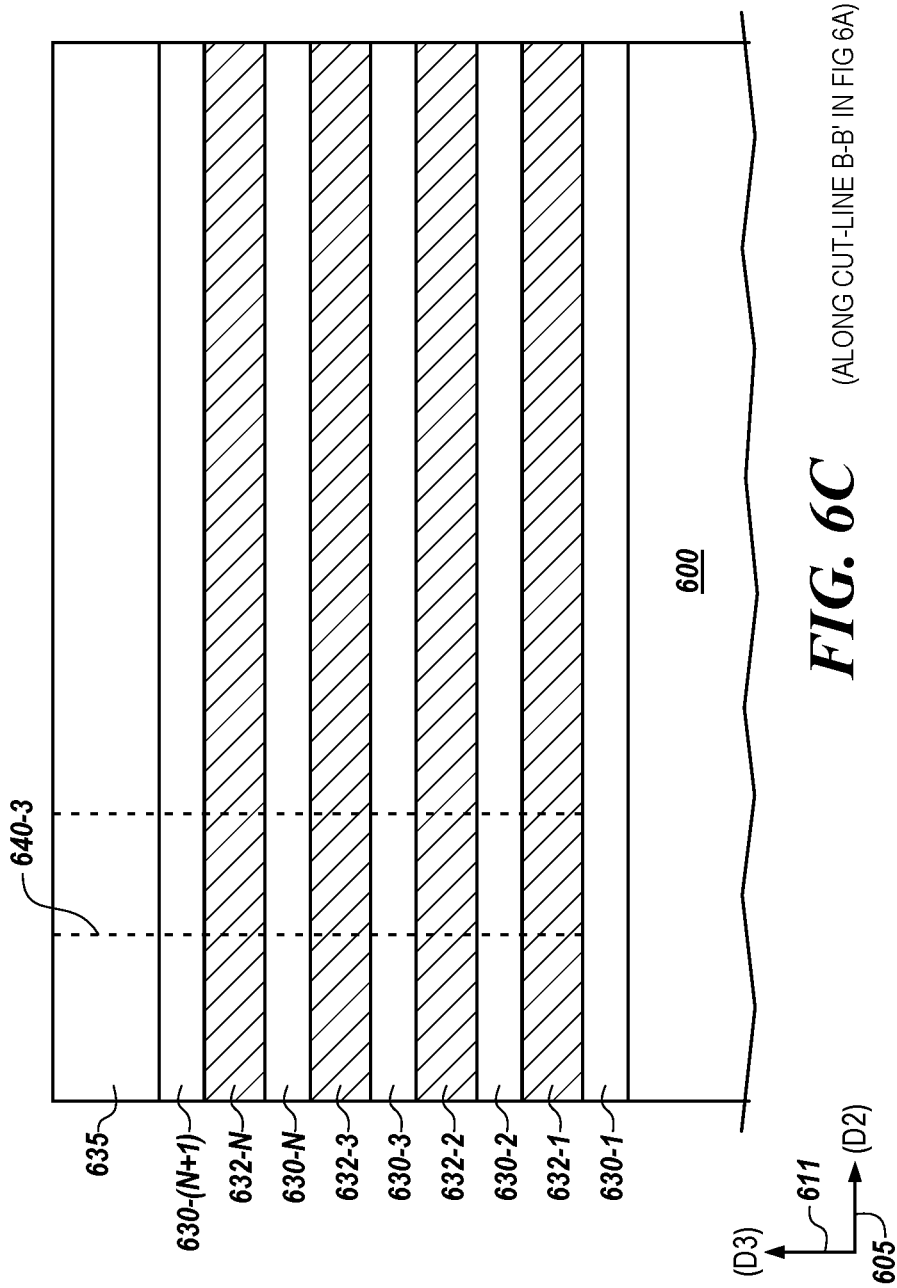

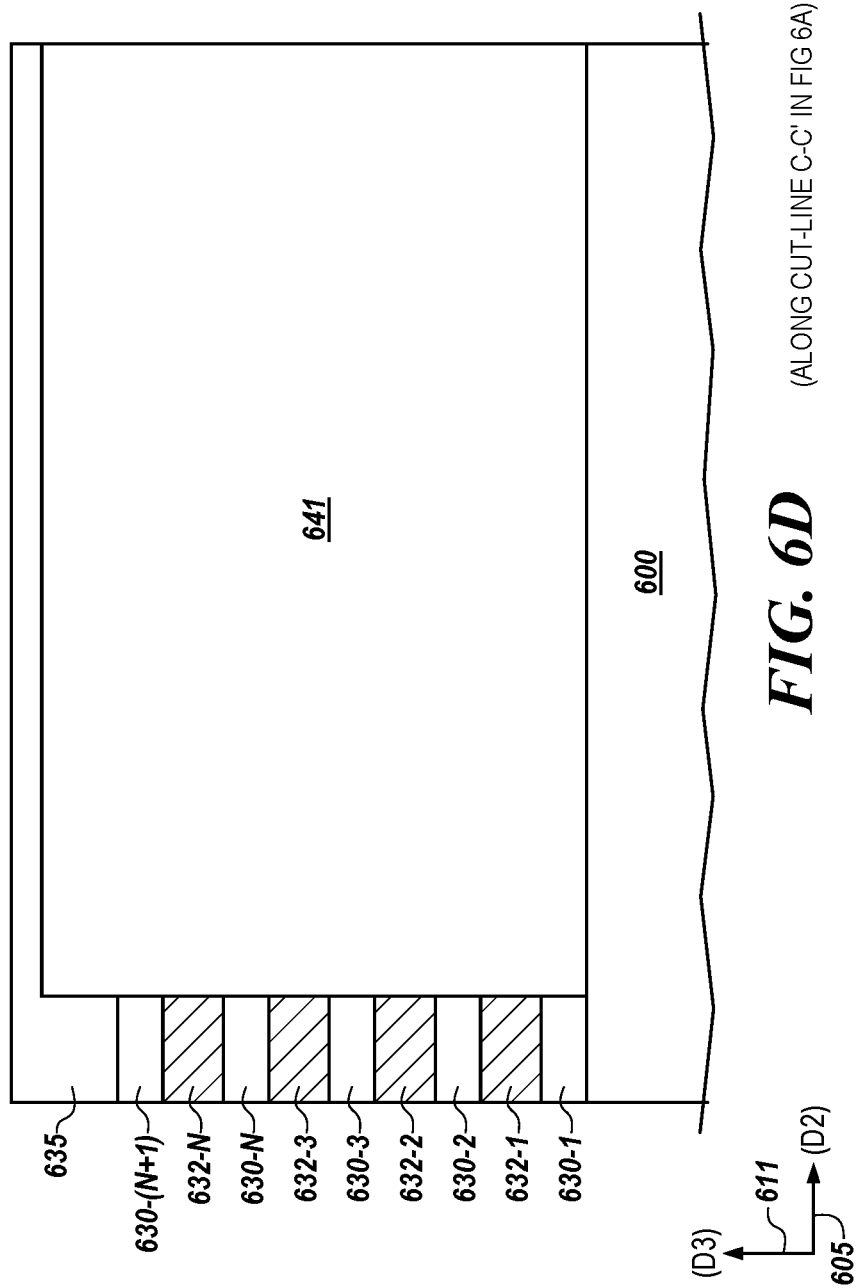

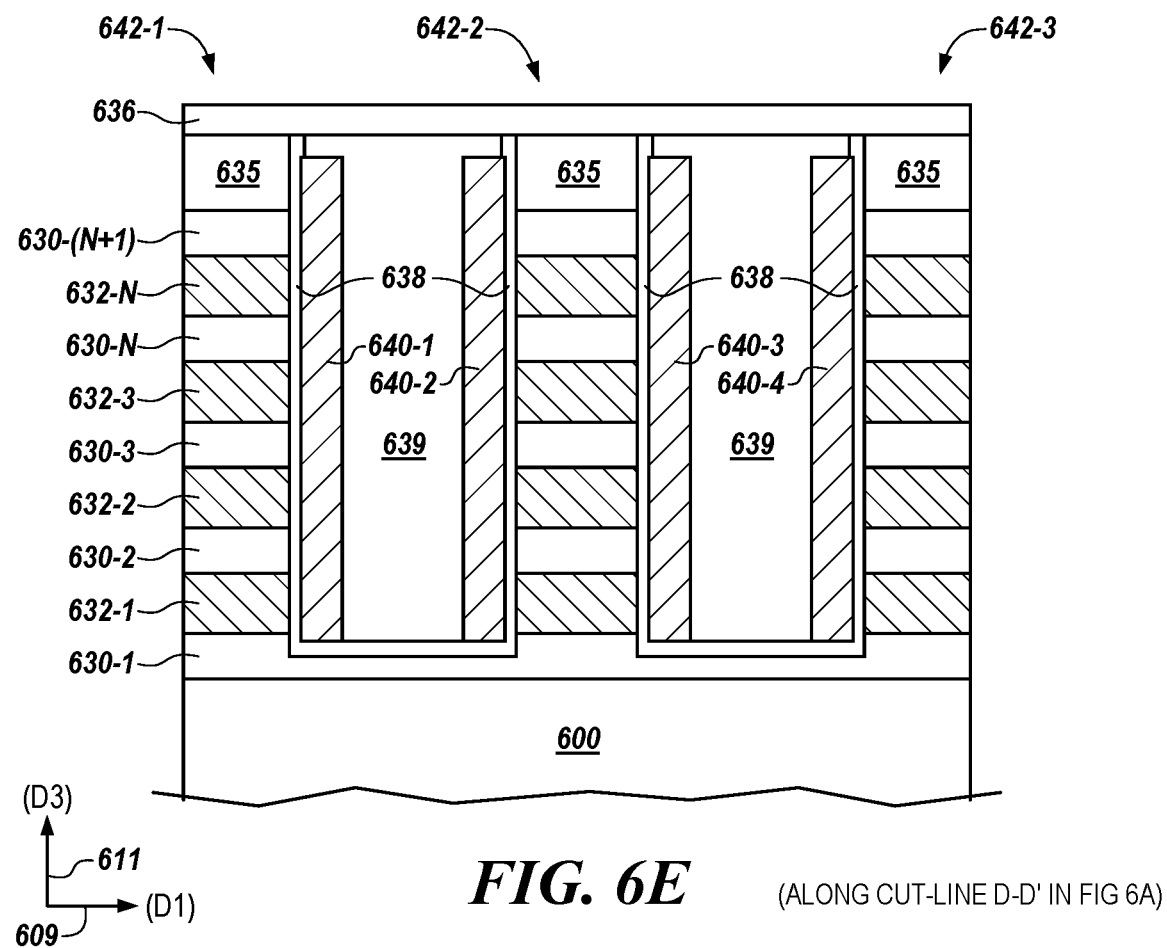
FIG. 6E (ALONG CUT-LINE D-D' IN FIG 6A)

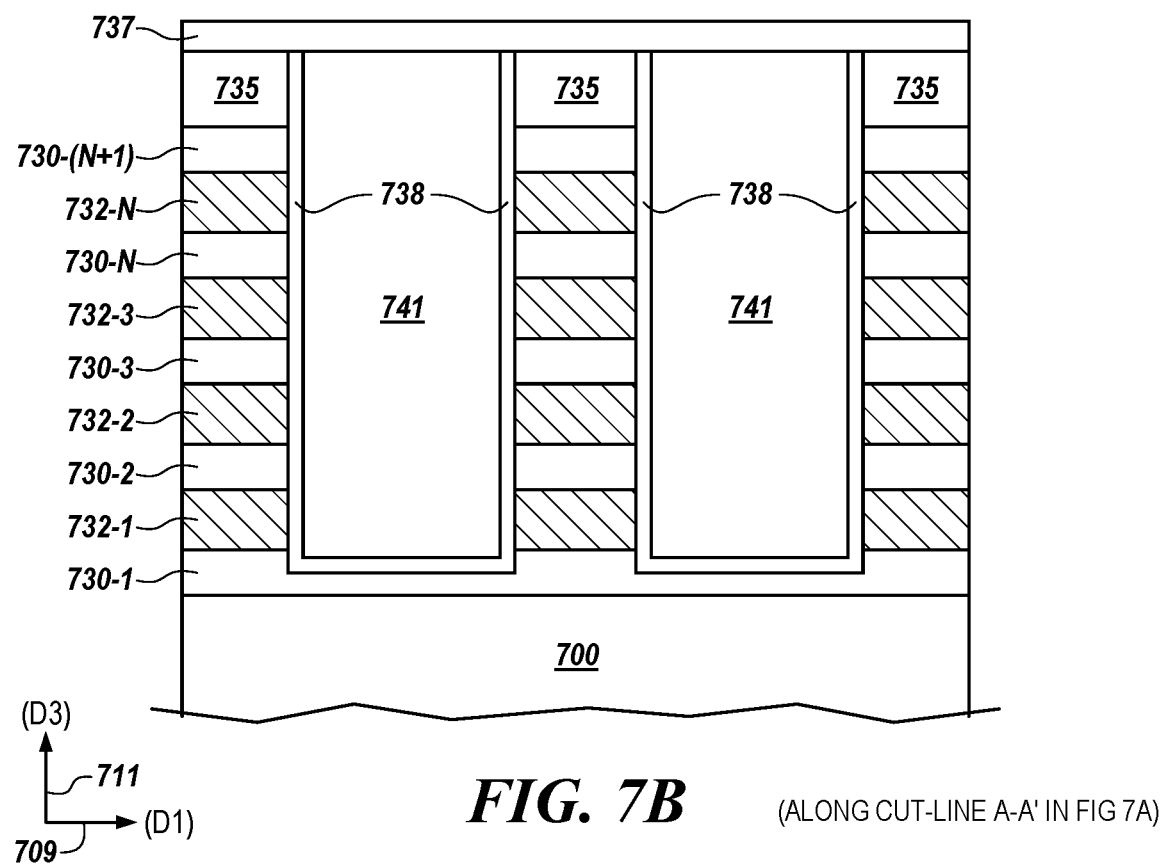
FIG. 7B  (ALONG CUT-LINE A-A' IN FIG 7A)

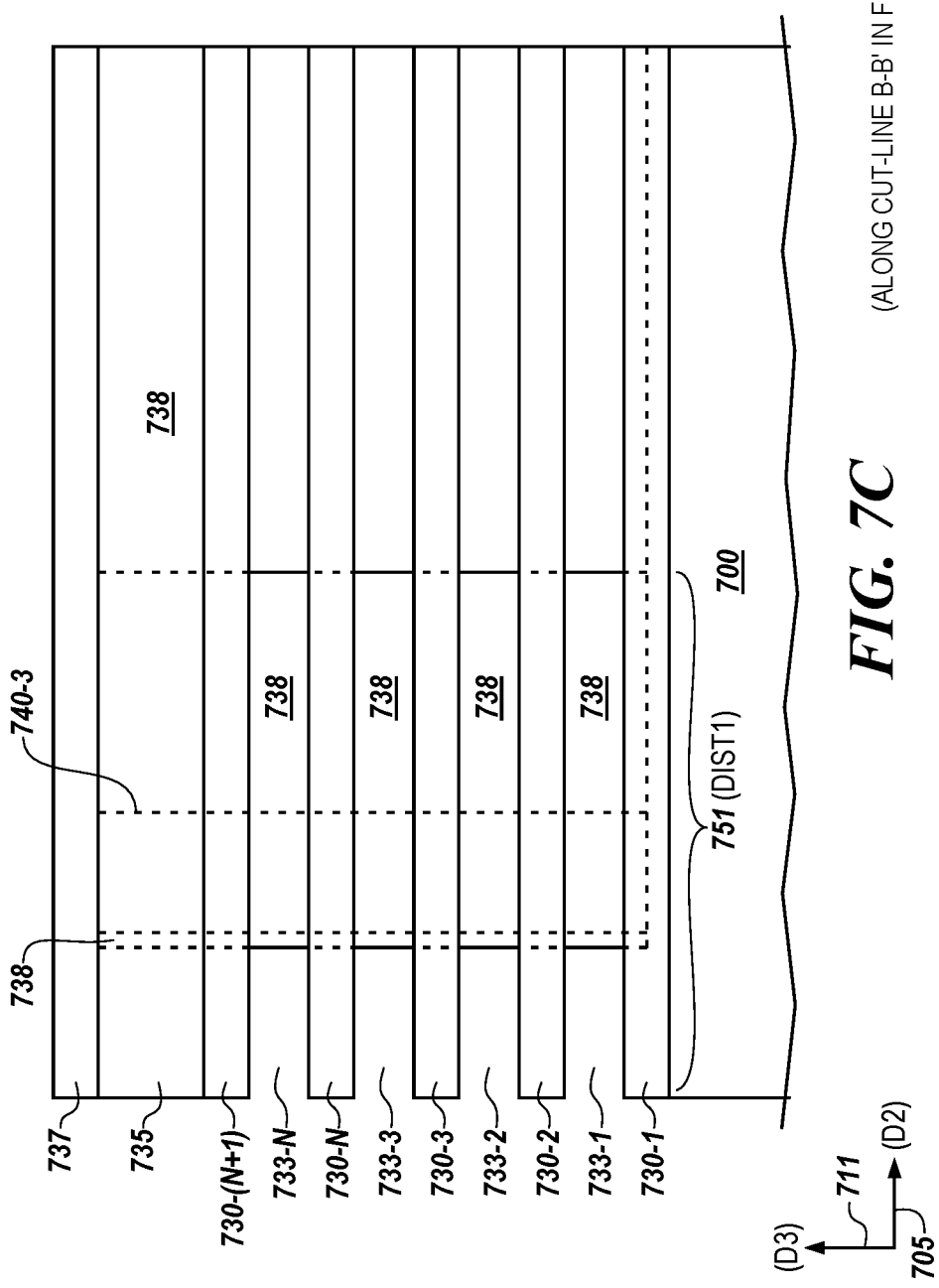

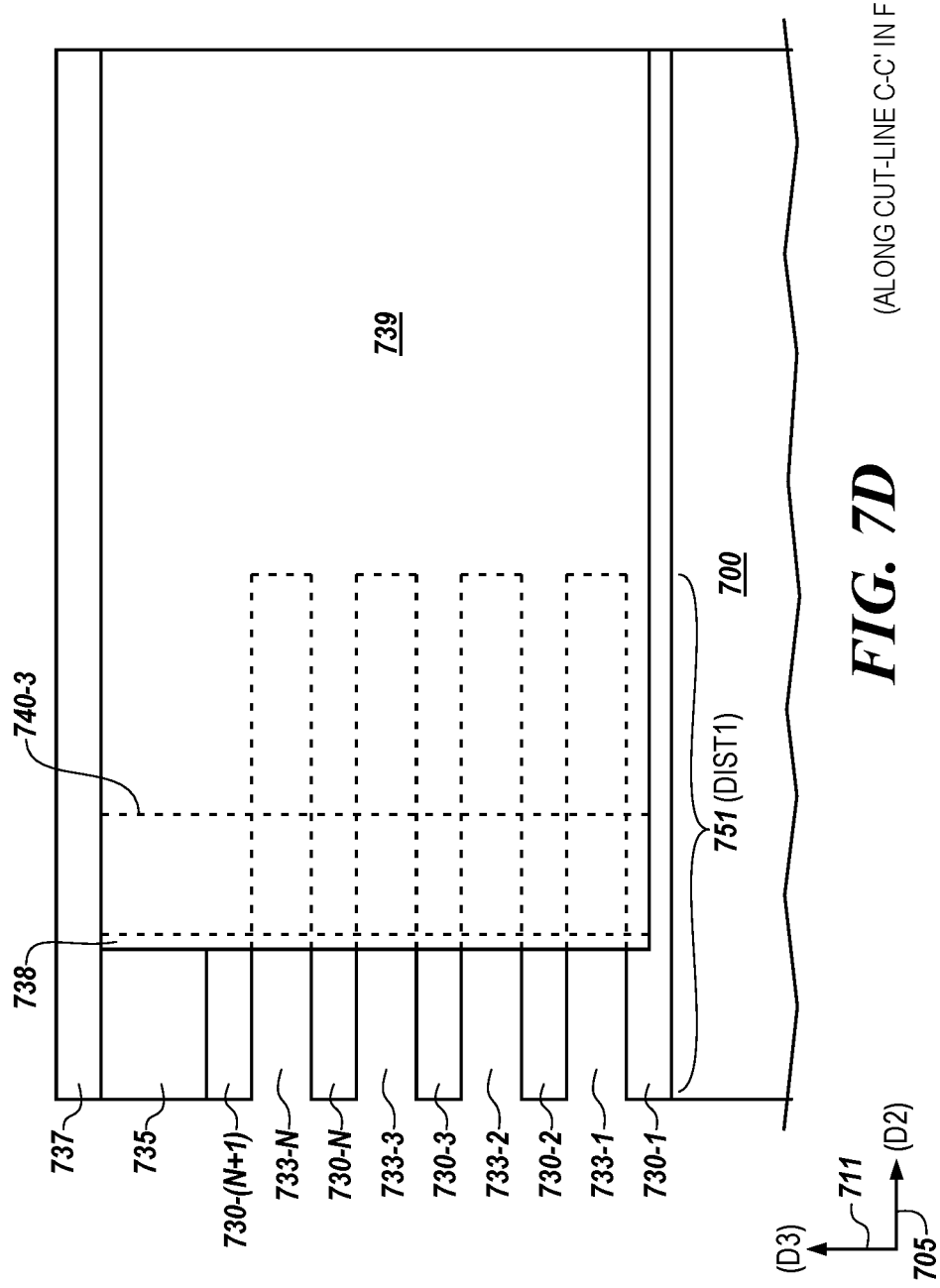
FIG. 7D (ALONG CUT-LINE C-C' IN FIG 7A)

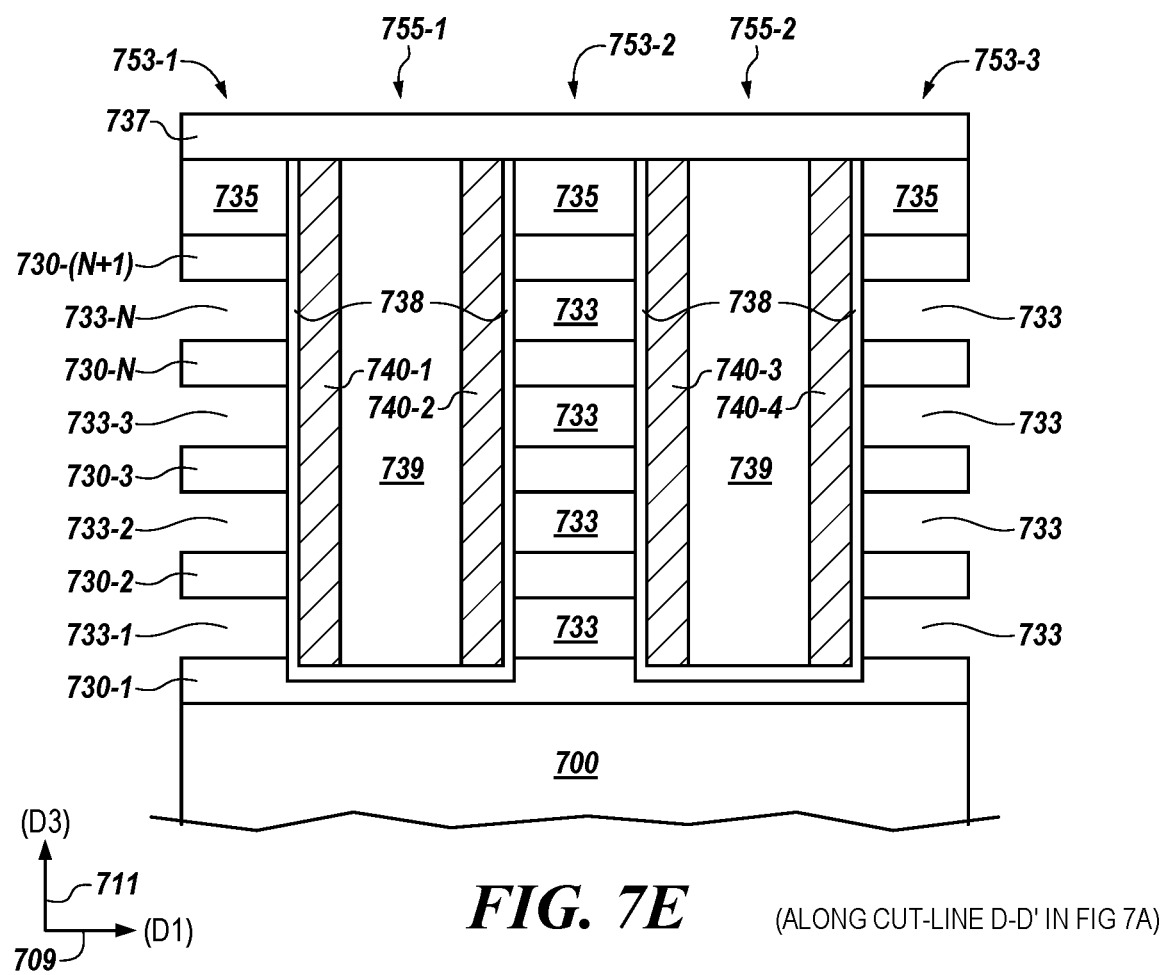
FIG. 7E (ALONG CUT-LINE D-D' IN FIG 7A)

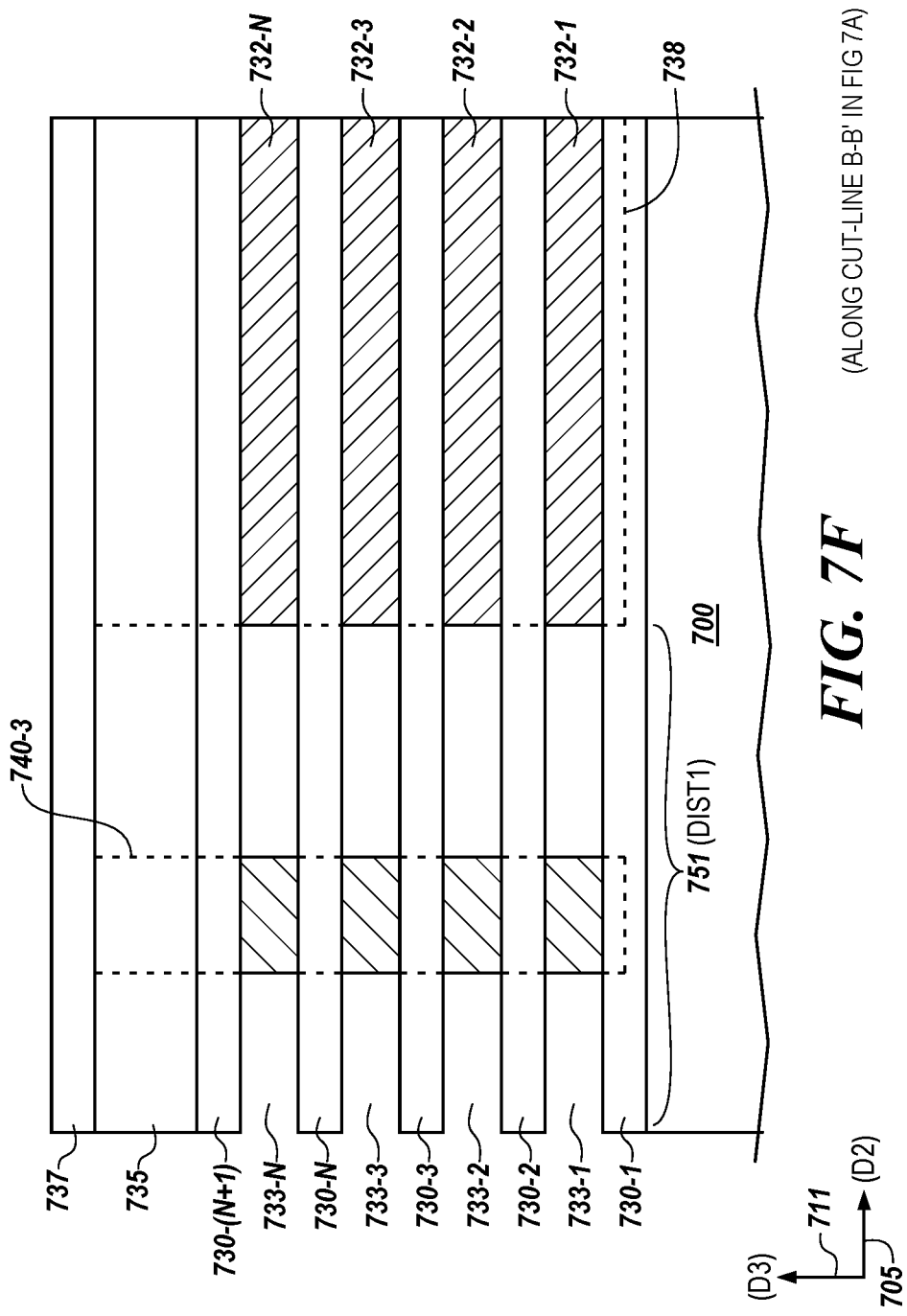
FIG. 7F (ALONG CUT-LINE B-B' IN FIG 7A)

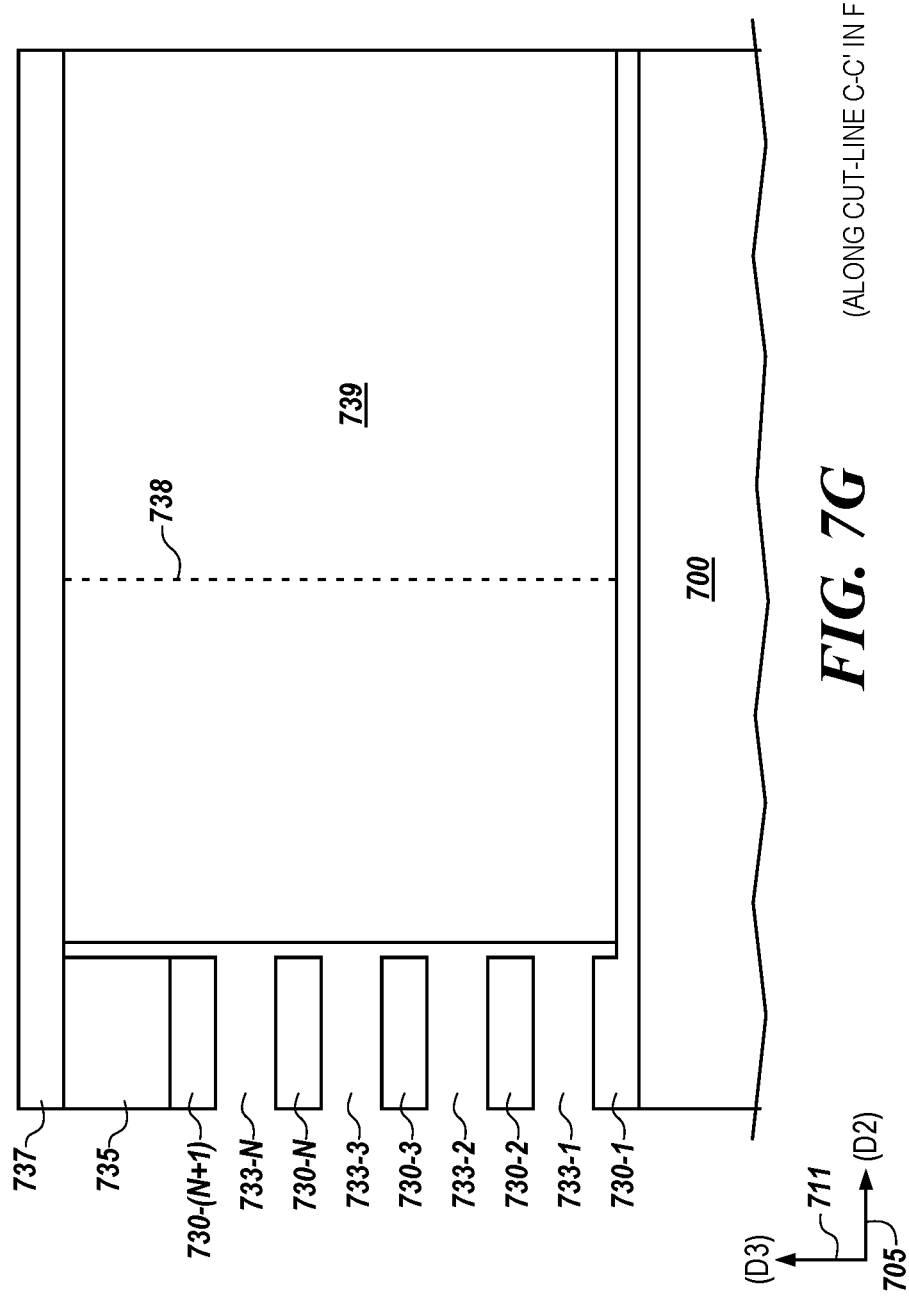

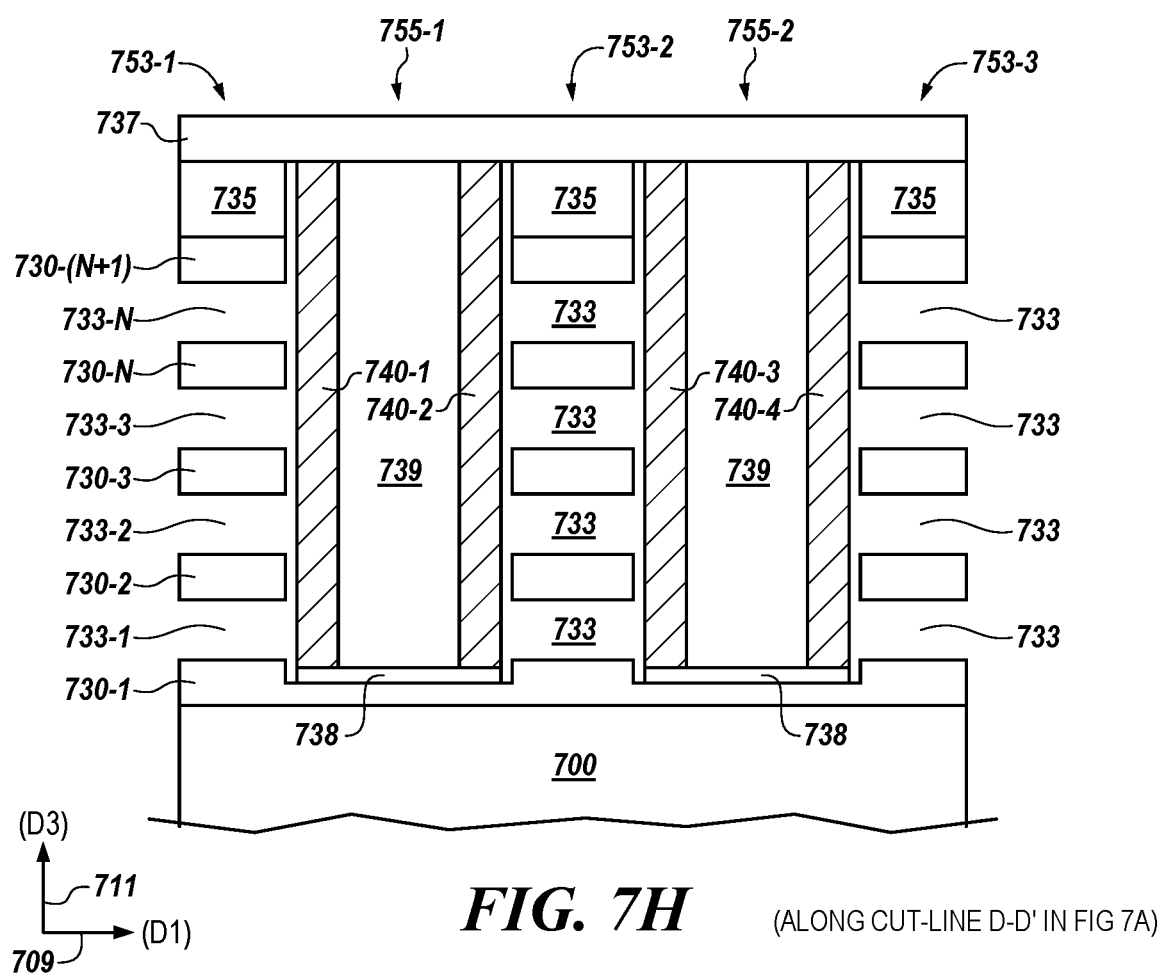
*FIG. 7H* (ALONG CUT-LINE D-D' IN FIG 7A)

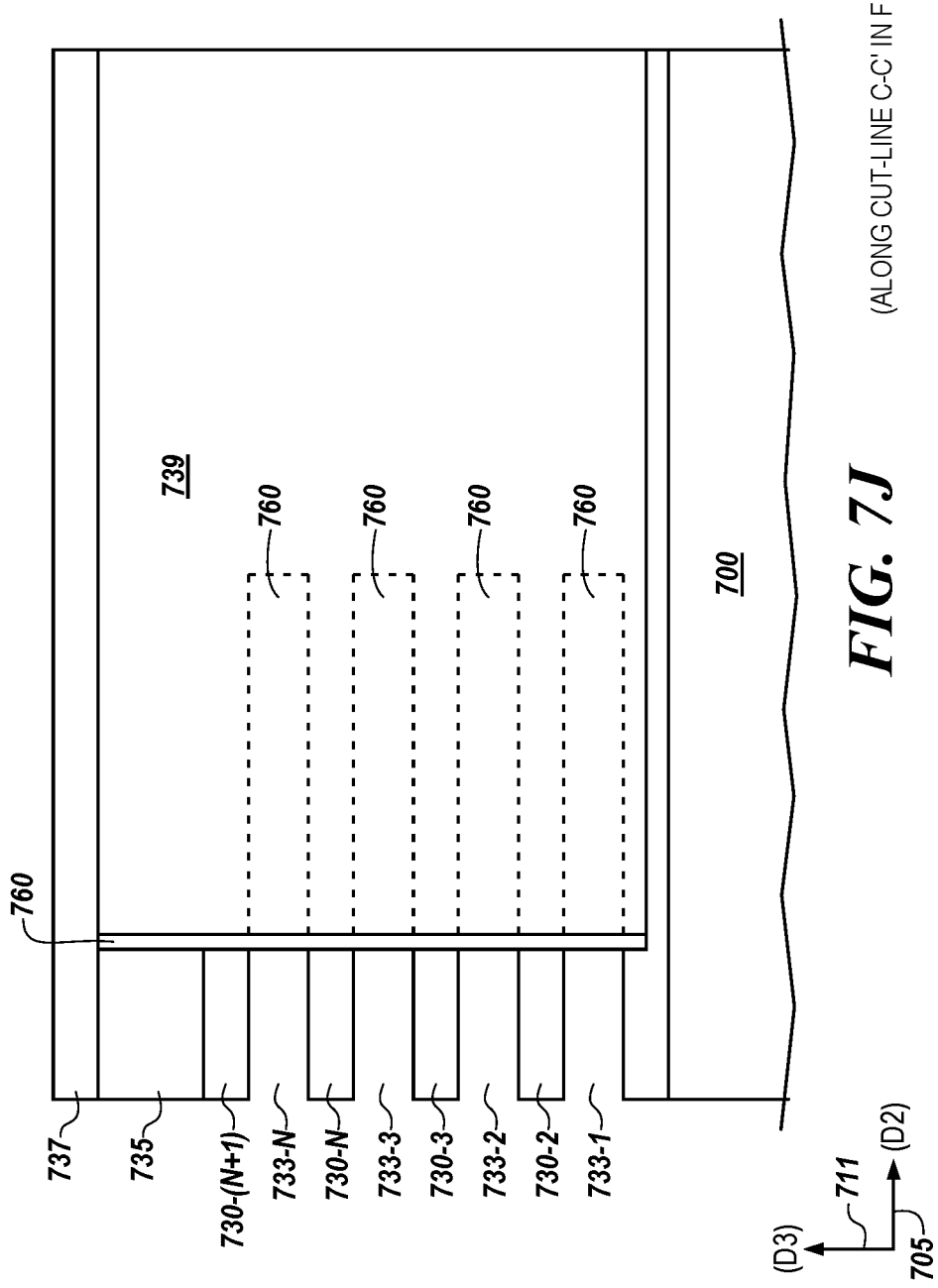
FIG. 7J (ALONG CUT-LINE C-C' IN FIG 7A)

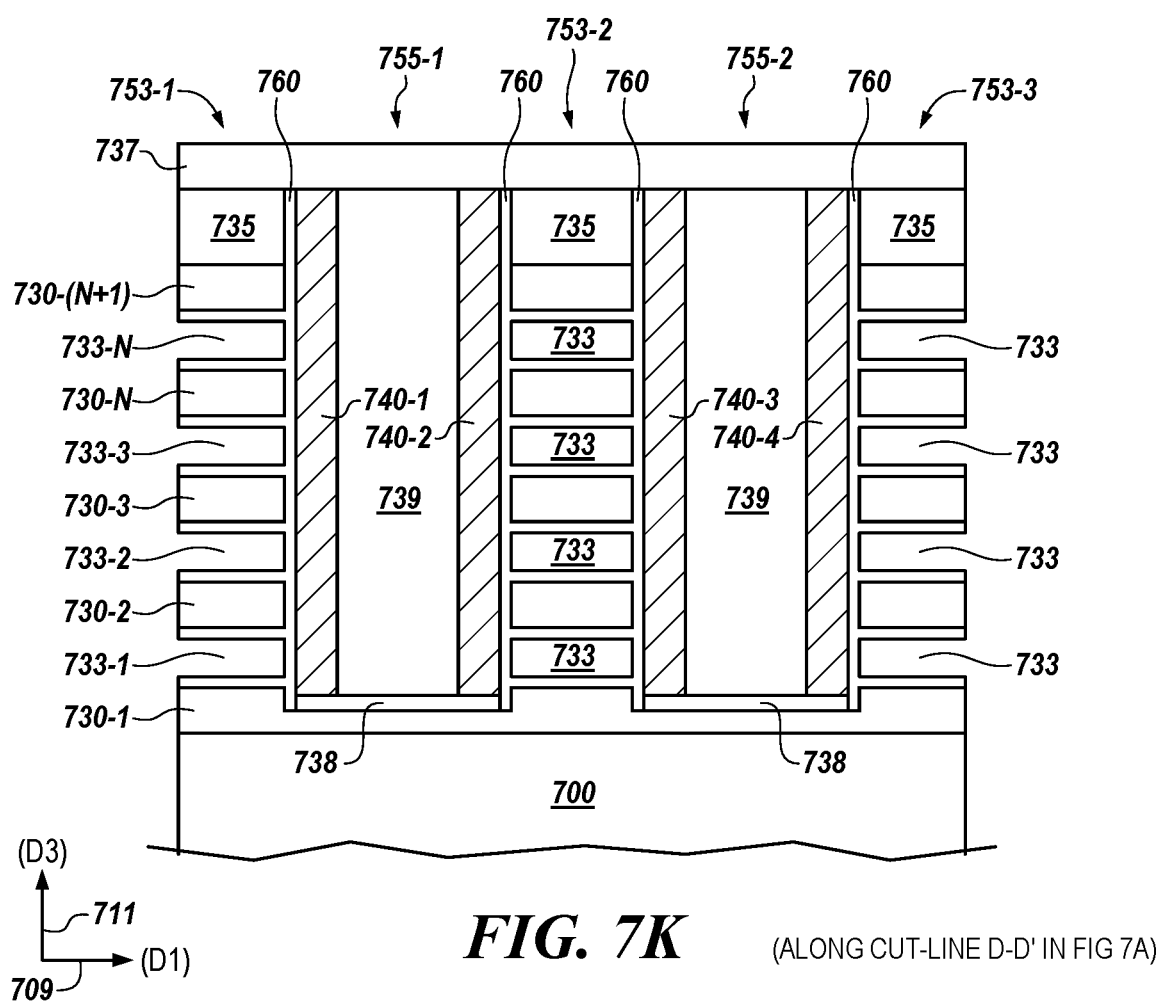
FIG. 7K (ALONG CUT-LINE D-D' IN FIG 7A)

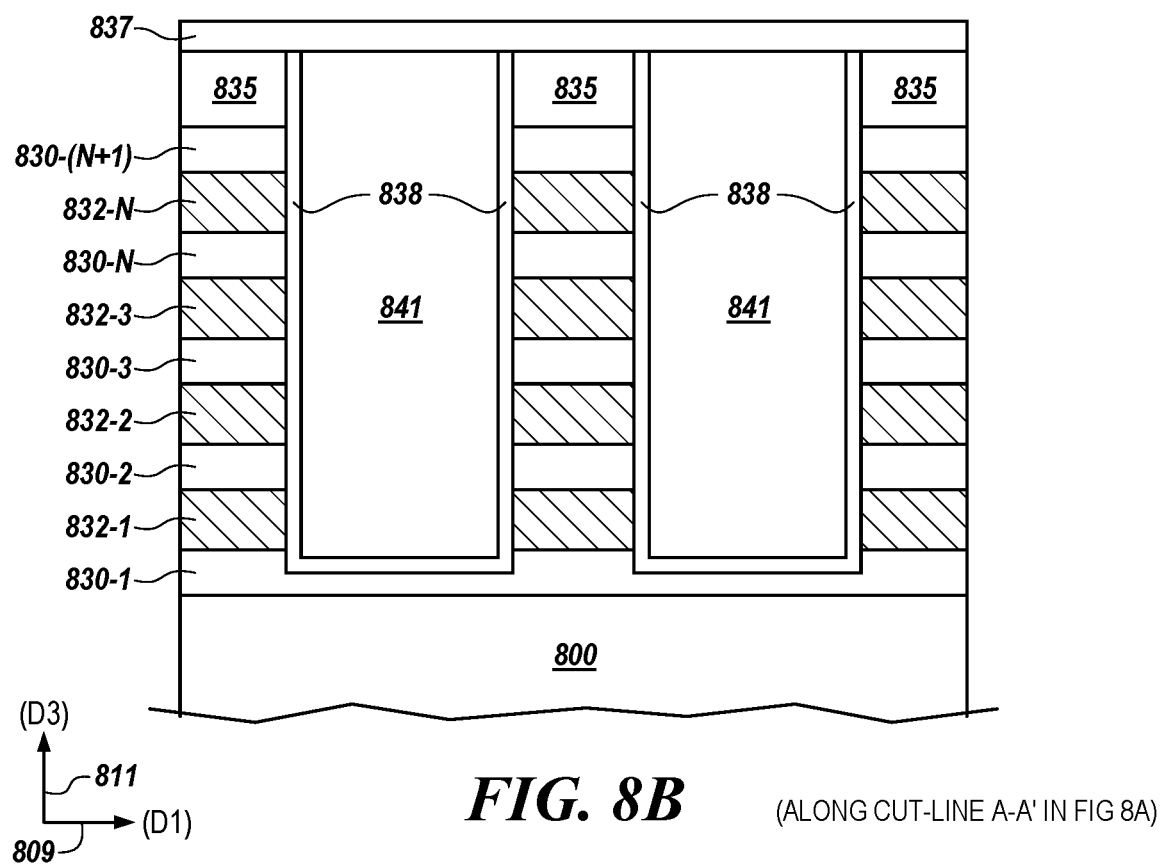
FIG. 8B (ALONG CUT-LINE A-A' IN FIG 8A)

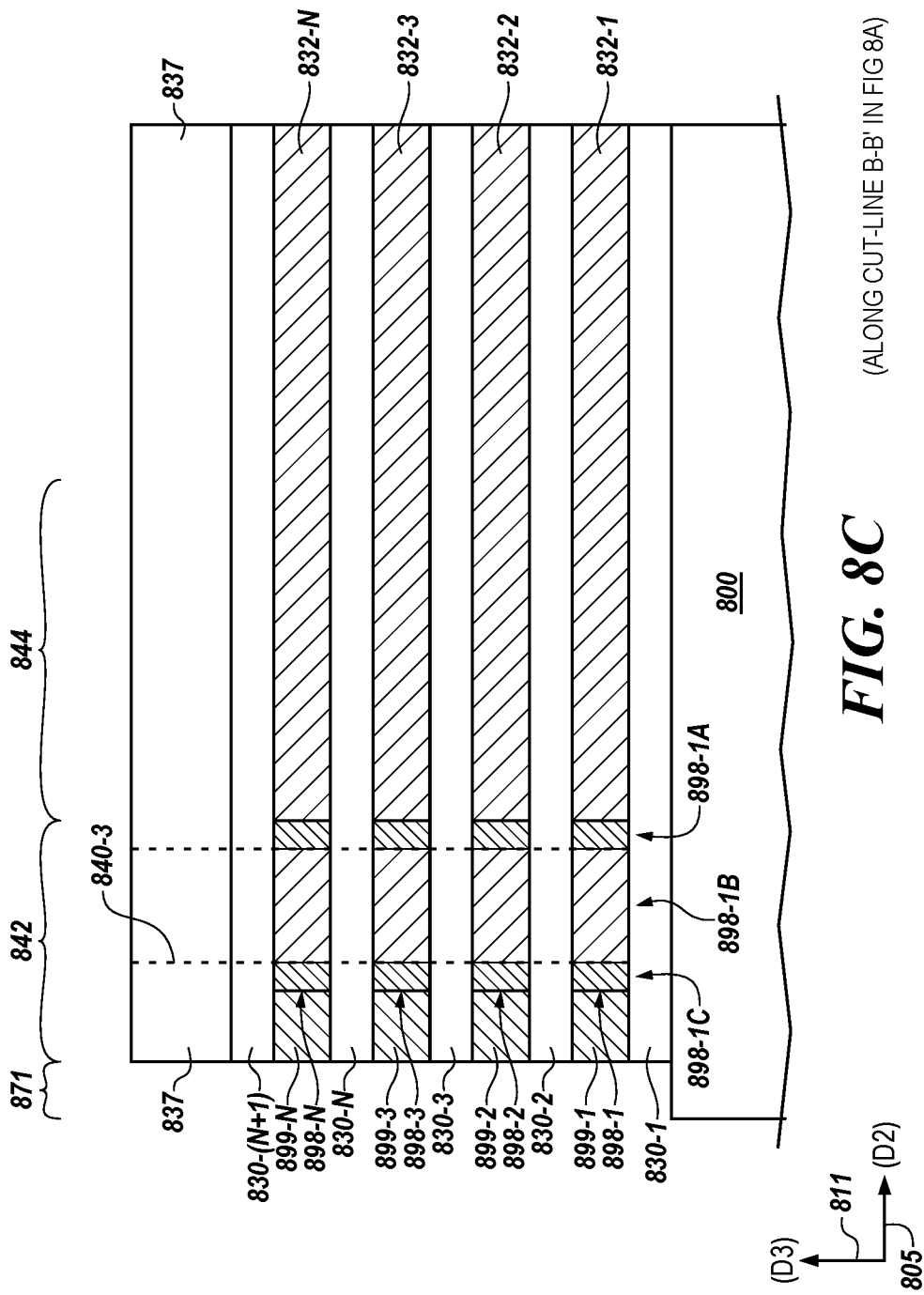
FIG. 8C (ALONG CUT-LINE B-B' IN FIG 8A)

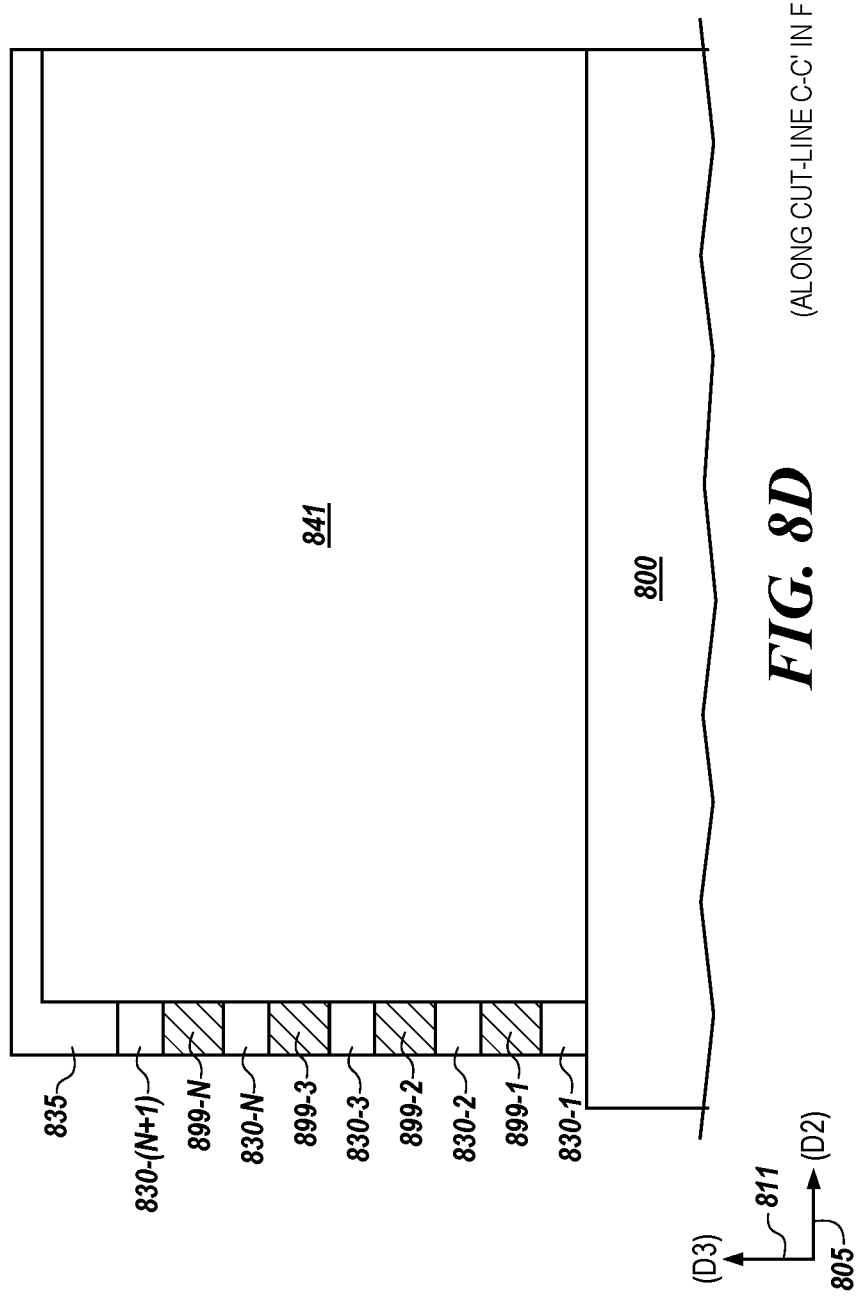

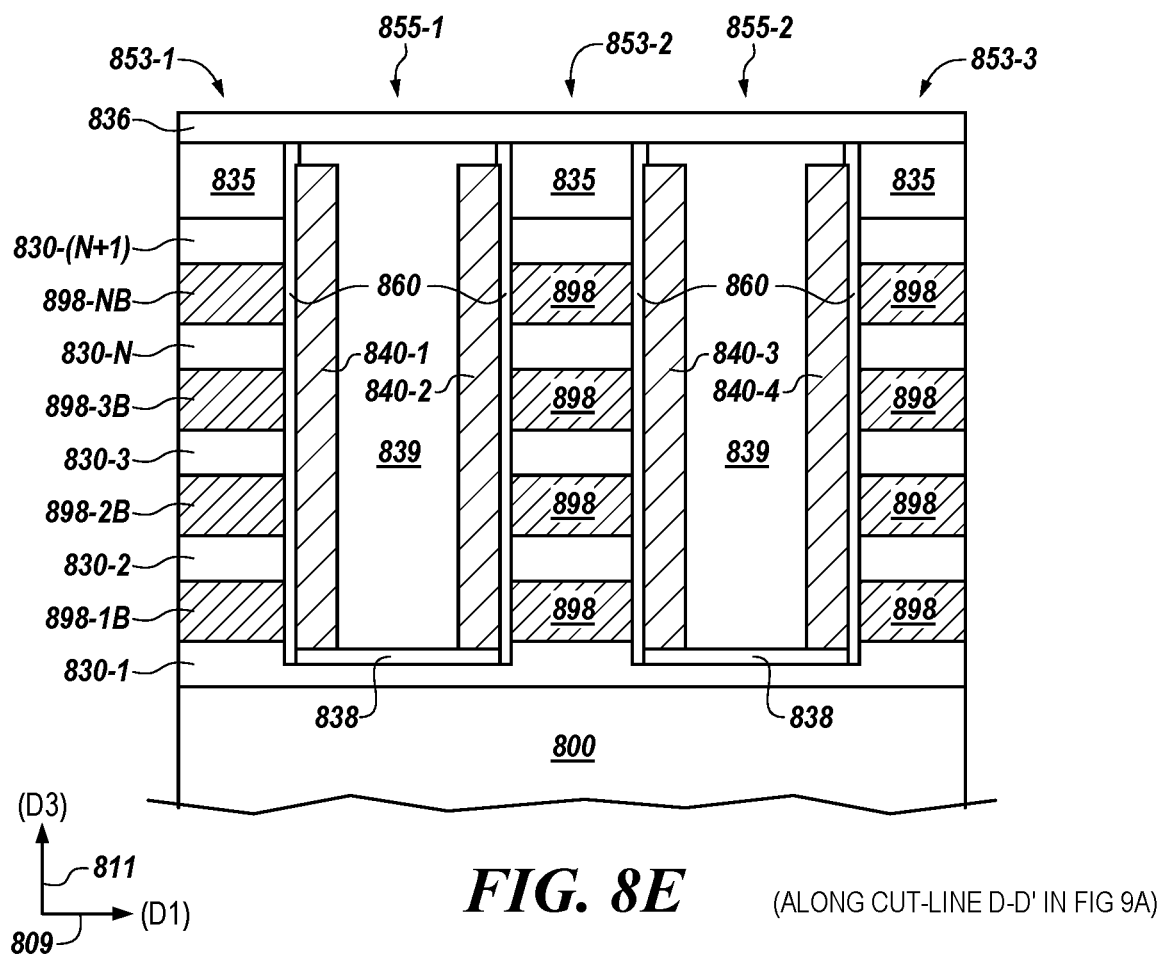
FIG. 8E (ALONG CUT-LINE D-D' IN FIG 9A)

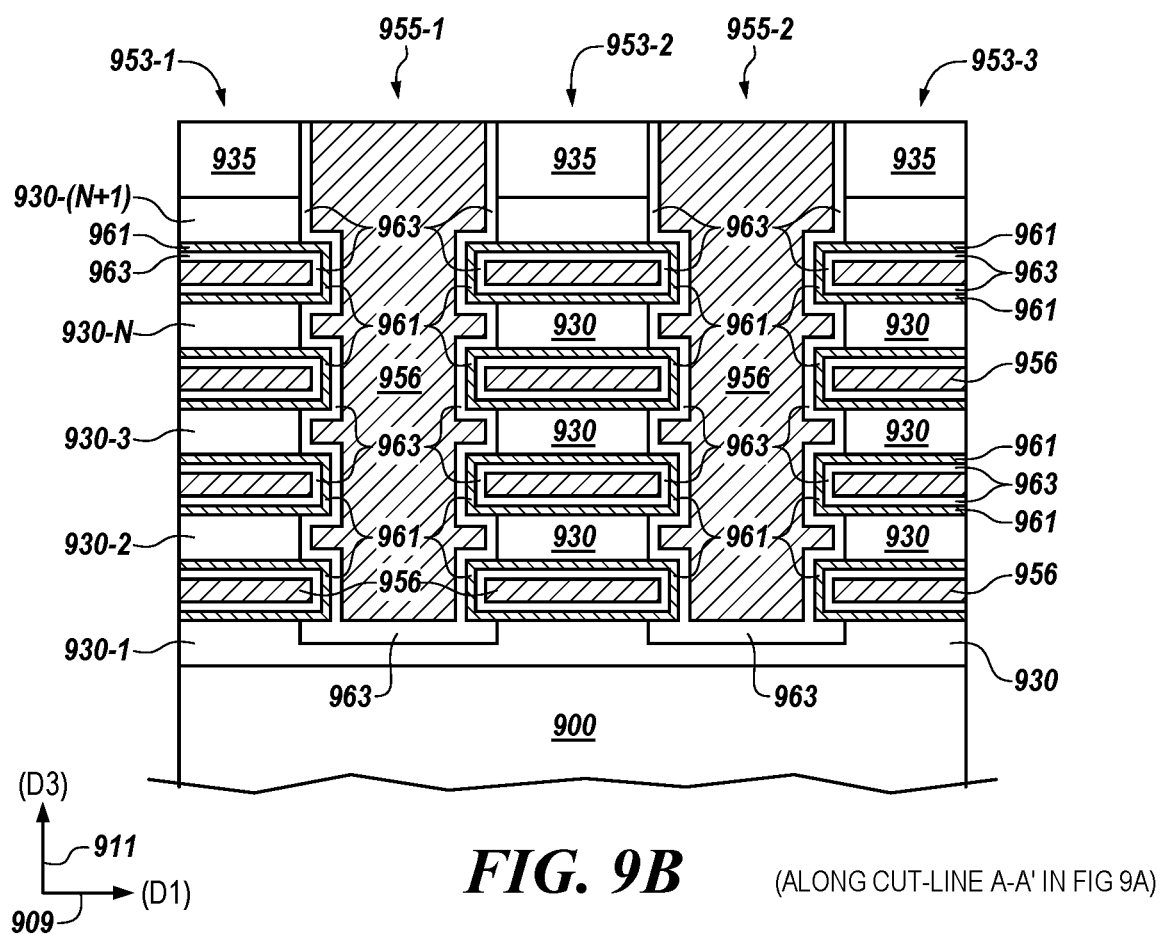
FIG. 9B (ALONG CUT-LINE A-A' IN FIG 9A)

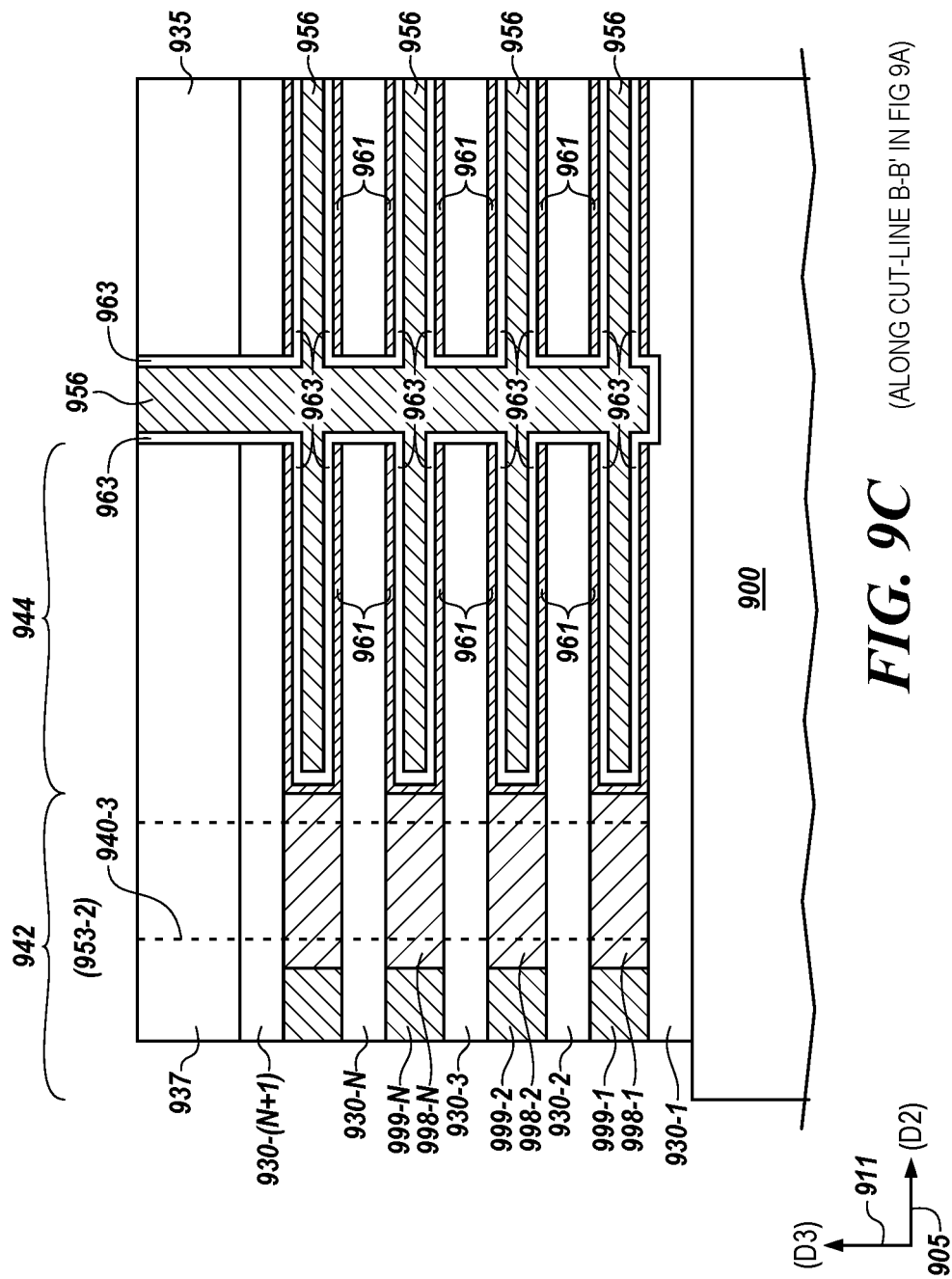
FIG. 9C (ALONG CUT-LINE B-B' IN FIG 9A)

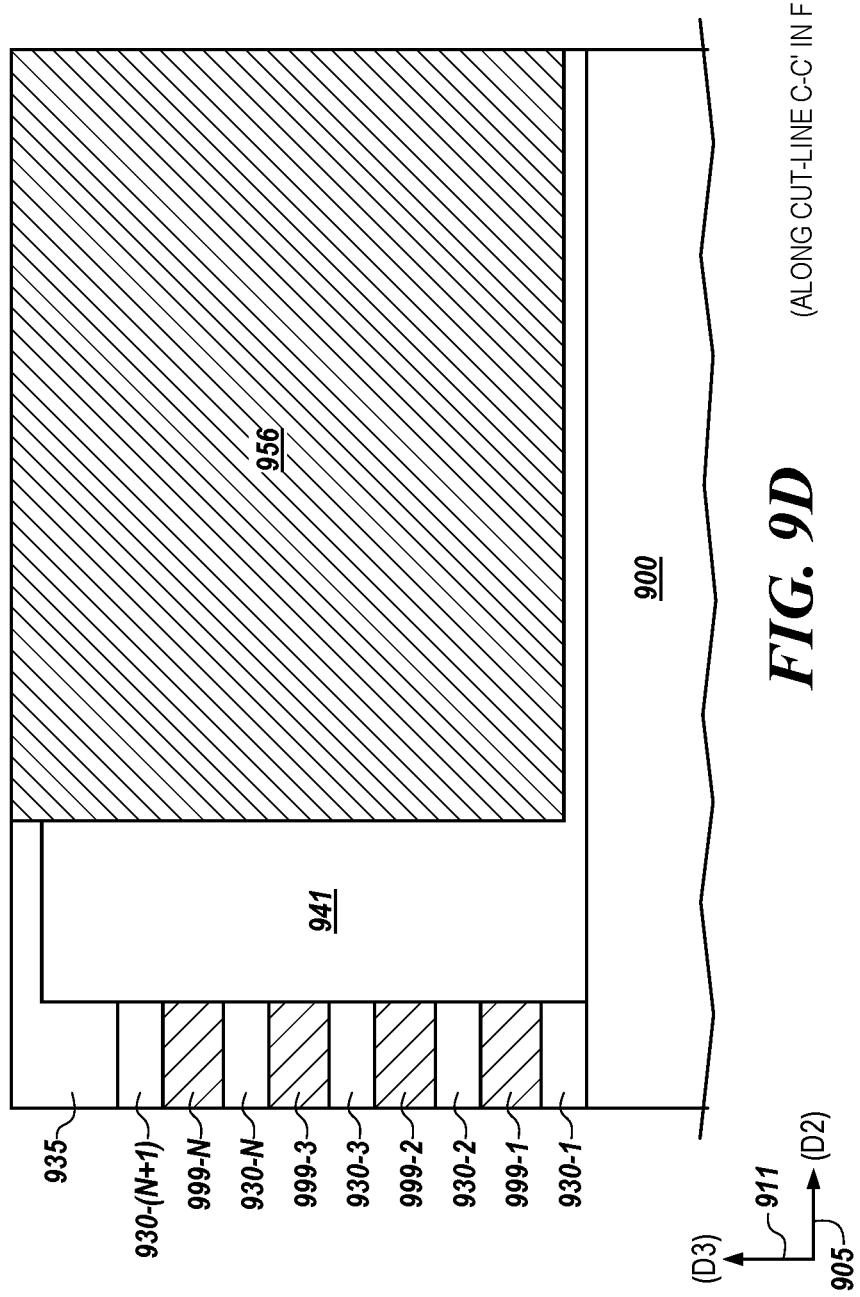

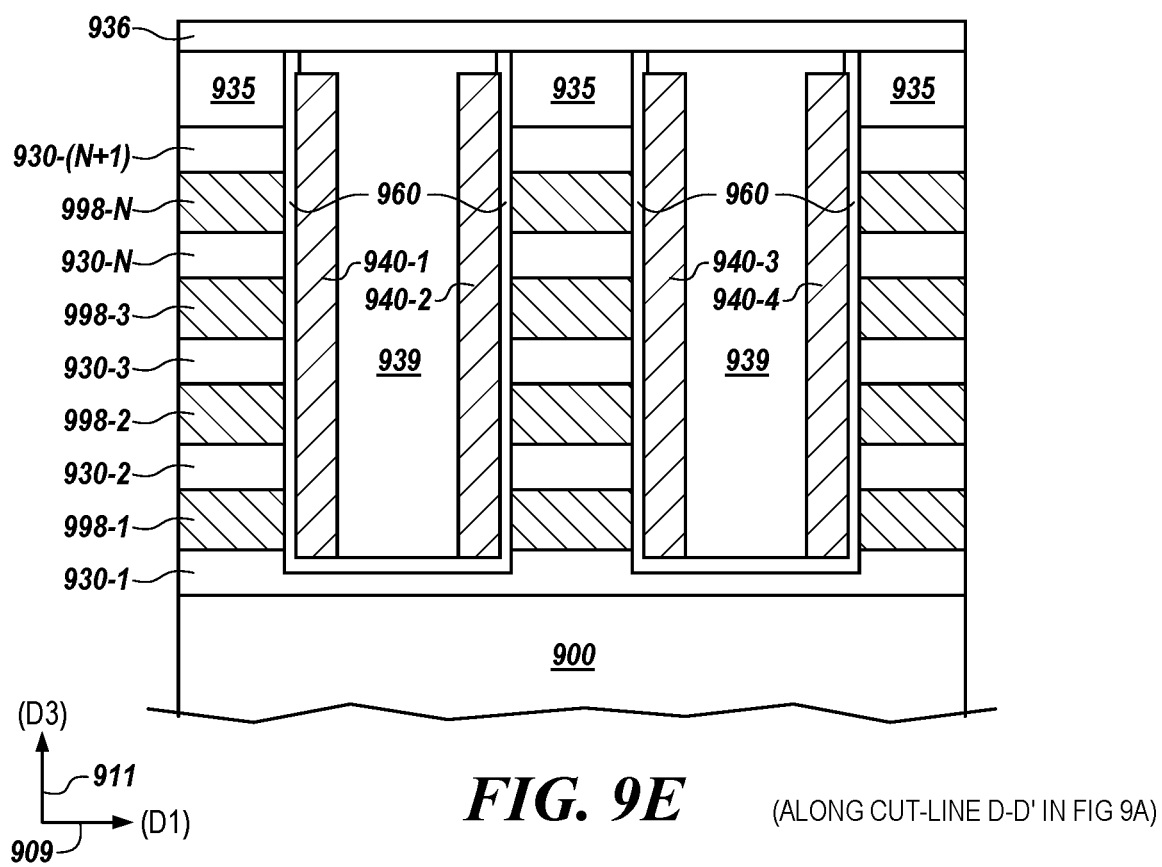
FIG. 9E (ALONG CUT-LINE D-D' IN FIG 9A)

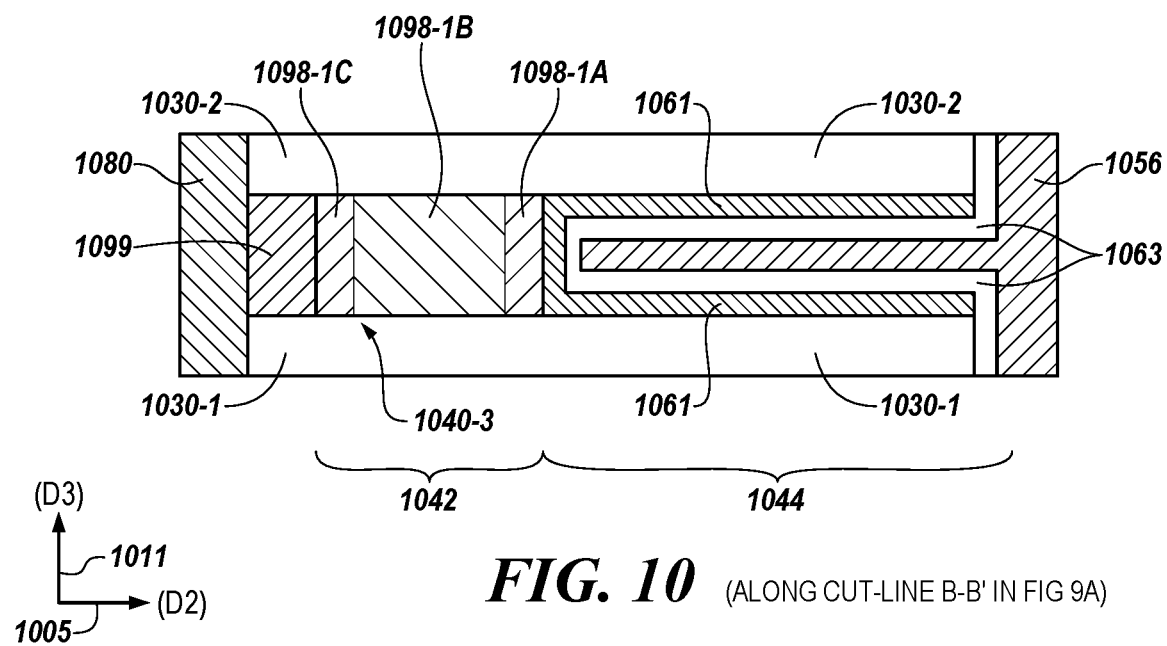
FIG. 10 (ALONG CUT-LINE B-B' IN FIG 9A)

US 11,239,117 B1

REPLACEMENT GATE DIELECTRIC IN THREE-NODE ACCESS DEVICE FORMATION FOR VERTICAL THREE DIMENSIONAL (3D) MEMORY

TECHNICAL FIELD

The present disclosure relates generally to memory devices, and more particularly, to storage node after three-node access device formation and structure for vertical three dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 5A-5B illustrate an example method, at another stage of a semiconductor fabrication process, for forming arrays of vertically stacked memory cells, having three-node horizontally oriented access devices and vertically oriented access lines, in accordance with a number of embodiments of the present disclosure.

FIGS. 6A to 6E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 7A to 7K illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 8A to 8E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 9A to 9E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIG. 10 illustrates an example of a three-node horizontally oriented access device coupled to a horizontally oriented storage node and coupled to vertically oriented access lines and horizontally oriented digit lines, in accordance with a number of embodiments of the present disclosure.

DETAILED DESCRIPTION

Figure 1:
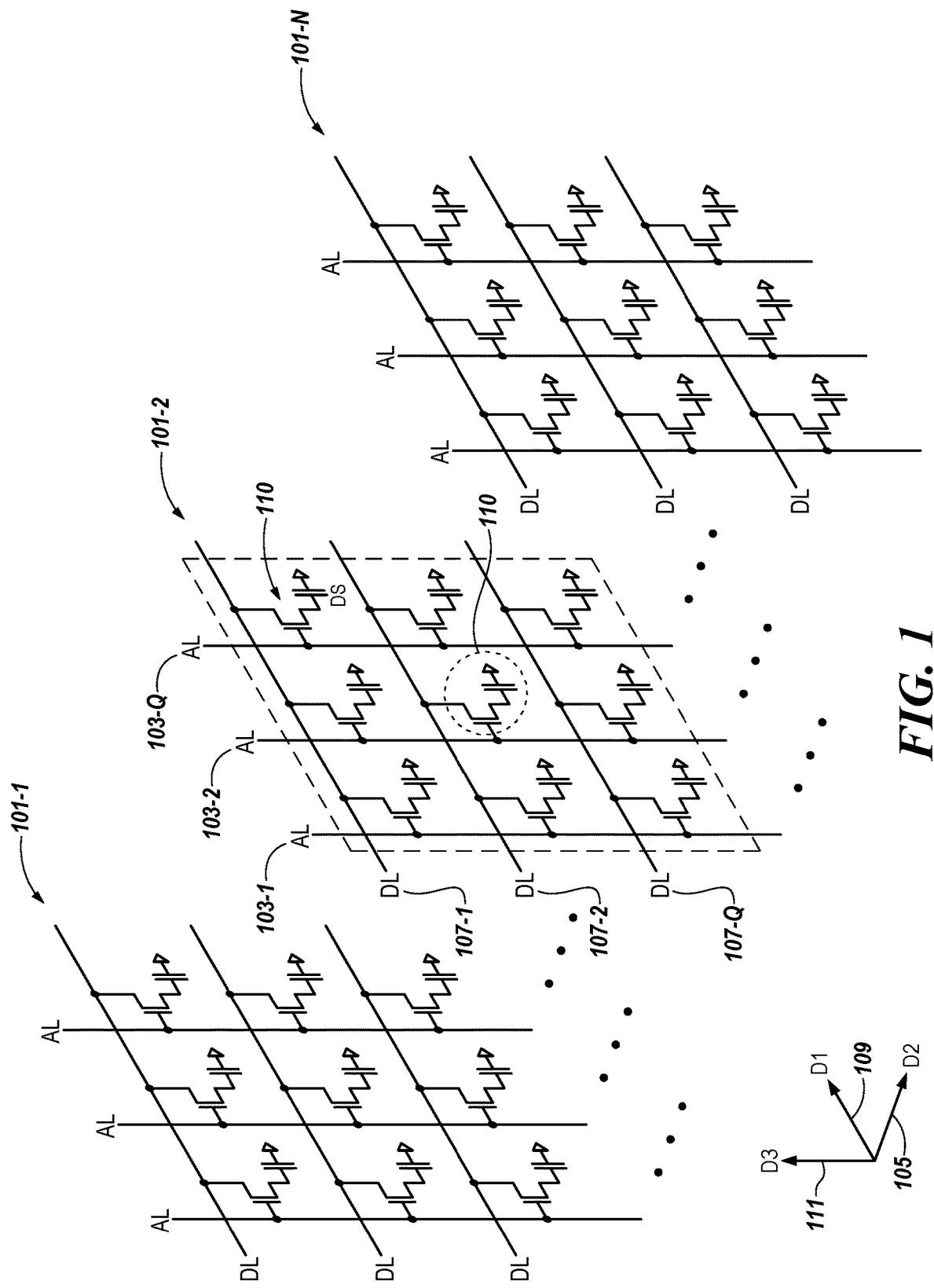
FIG. 1 is a schematic illustration of a vertical three dimensional (3D) memory in accordance a number of embodiments of the present disclosure.

Embodiments of the present disclosure describe a three-node access device for vertical three dimensional (3D) memory. Three-node horizontal access devices are formed without body region contacts. As used herein, three-node is intended to refer to an access device comprising (1) a first source/drain region and (2) a second source/drain region separated by a channel region, and (3) one or more gates(s) opposing the channel region. The three-node horizontal access devices are integrated with vertical access lines and integrated with horizontal digit lines. According to embodiments, the three-node horizontal access devices may be formed such that the channel region has fewer, e.g., may operate free of, minority carriers thus removing the need to control a body potential to a body region of the access device. Advantages to the structure and process described herein can include a lower off-current (Ioff) for the access devices, as compared to silicon based (Si-based) access devices, and/or reduced gate/drain induced leakage (GIDL) for the access devices.

According to embodiments gate dielectric material replacement fabrication steps are performed before a capacitor cell formation process. The digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process overhead. A further benefit is the avoidance, e.g., no use of, gas phase doping (GPD) in the formation of the source/drain regions.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a block diagram of an apparatus in accordance a number of embodiments of the present disclosure. FIG. 1 illustrates a circuit diagram showing a cell array of a three dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a wordlines). Also, each of the sub cell arrays, e.g., sub cell array 101-2, may include a plurality of digit lines 107-1, 107-2, . . . , 107-P (which also may be referred to as bitlines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third, vertical direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, third direction (D3) 111.

A memory cell, e.g., 110, may include an access device, e.g., access transistor, and a storage node, e.g., capacitor, located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-, 101-2, . . . , 101-N. One memory cell, e.g. 110, may be located between one access line, e.g., 103-2, and one digit line, e.g., 107-2. Each memory cell may be uniquely addressed through a combination of an access line 103-1, 103-2, . . . , 103-Q and a digit line 107-1, 107-2, . . . , 107-P.

The digit lines 107-1, 107-2, . . . , 107-P may be or include conducting patterns (e.g., metal lines) disposed on and spaced apart from a substrate. The digit lines 107-1, 107-2, . . . , 107-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111.

The access lines 103-1, 103-2, . . . , 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109 by an insulating material.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
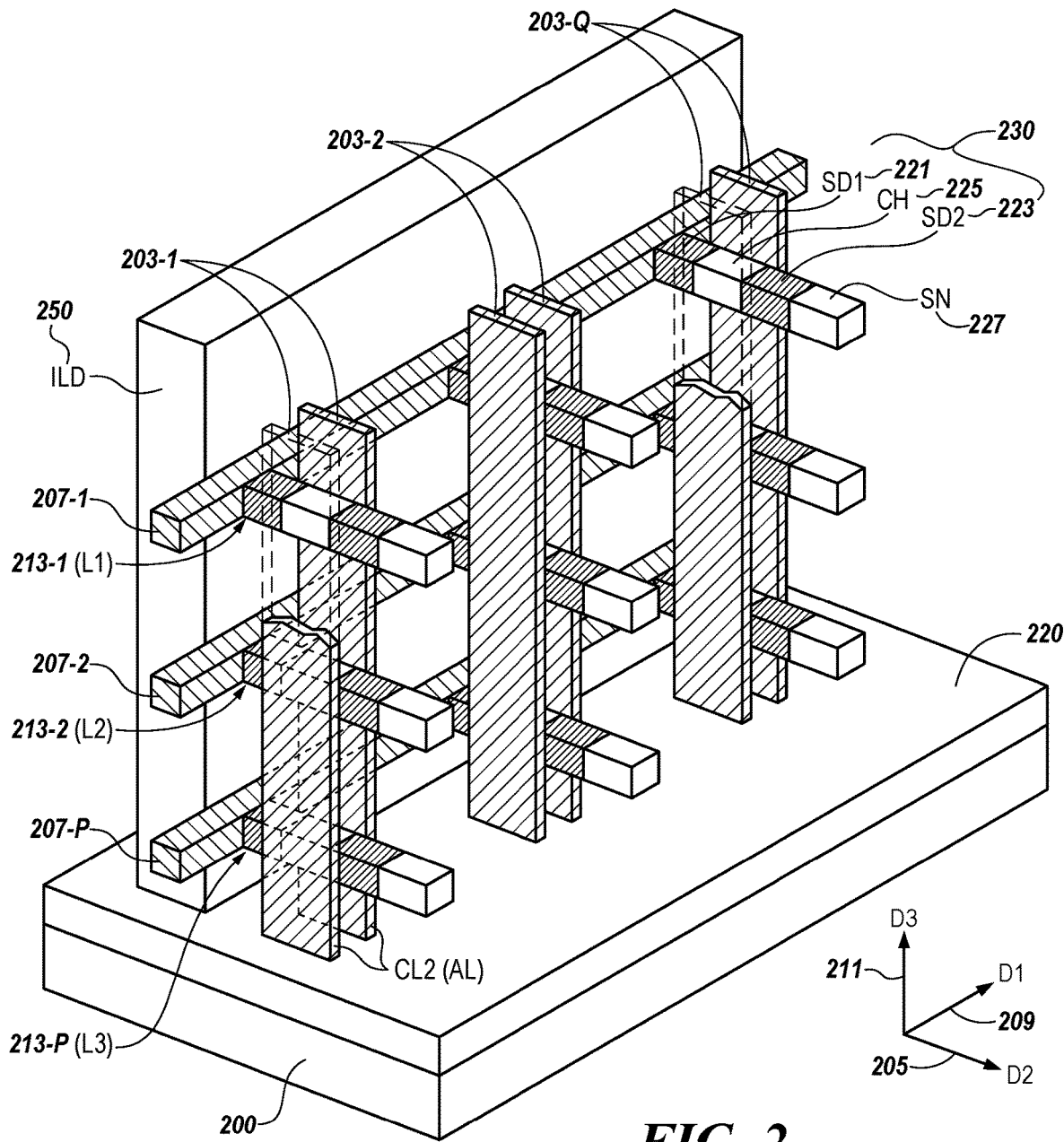
FIG. 2 is a perspective view illustrating a portion of a three-node access device in a vertical three dimensional (3D) memory array in accordance with a number of embodiments of the present disclosure.
Figure 3:
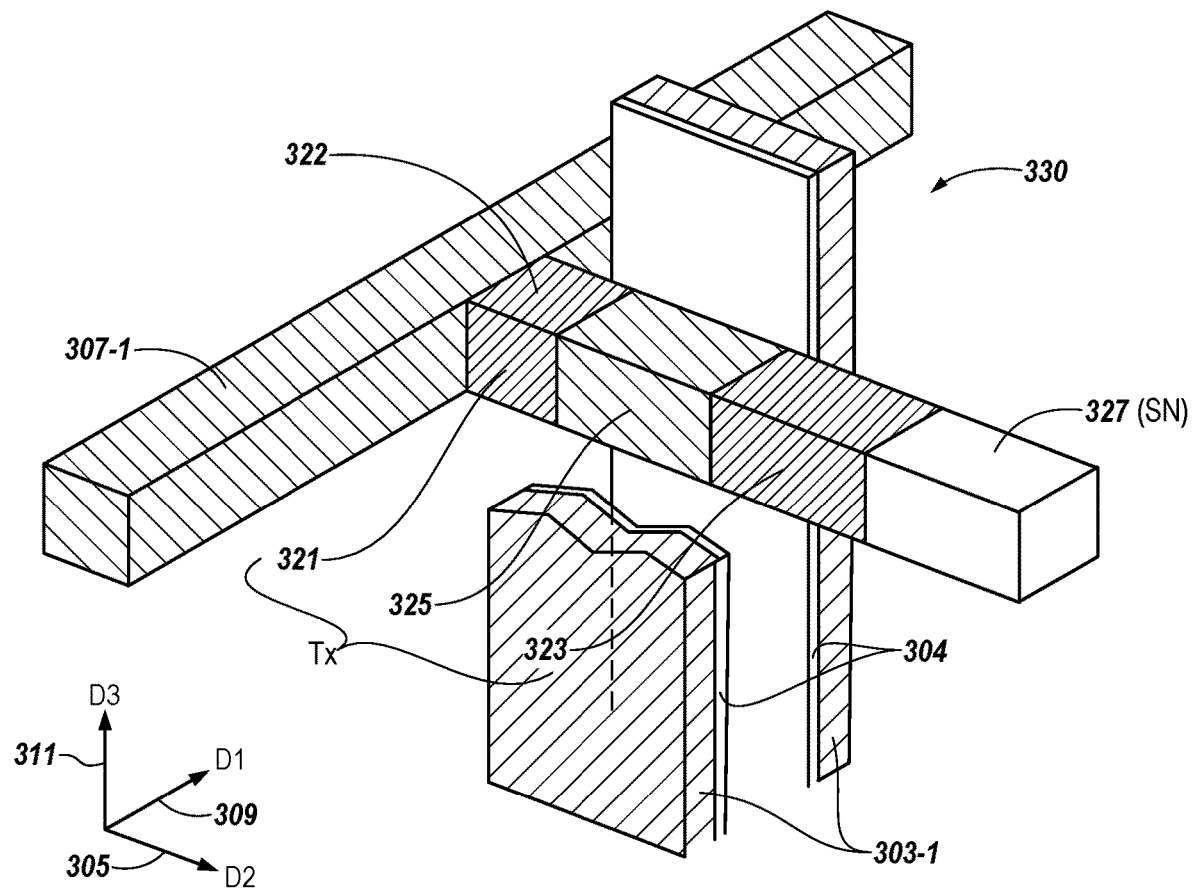
FIG. 3 is a perspective view illustrating a portion of a three-node access device in a vertical three dimensional (3D) memory cell in accordance with a number of embodiments of the present disclosure.

FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory array shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 111. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3) (also referred to herein as "tiers"). The repeating, vertical levels, L1, L2, and L3, may be arranged, e.g., "stacked", a vertical direction, e.g., third direction (D3) 111 shown in FIG. 1. Each of the repeating, vertical levels, L1, L2, and L3 may include a plurality of discrete components, e.g., regions, to the horizontally oriented access devices 230, e.g., transistors, and storage nodes, e.g., capacitors, including access line 103-1, 103-2, . . . , 103-Q connections and digit line 107-1, 107-2, . . . , 107-P connections. The plurality of discrete components to the horizontally oriented, three-node access devices, e.g., transistors 110 in FIG. 1, may be formed in a plurality of iterations of vertically, repeating layers within each level, as described in more detail below in connection with FIG. 4 et. seq., and may extend horizontally in the second direction (D2) 205, analogous to second direction (D2) 105 shown in FIG. 1.

The plurality of discrete components to the horizontally oriented three-node access devices 230, e.g., transistors, may include a first source/drain region 221 and a second source/drain region 223 separated by a channel region 225, extending in the second direction (D2) 205. Three-node horizontal access devices 230 are formed without body region contacts. As used herein, three-node is intended to refer to an access device comprising (1) a first source/drain region 221 and (2) a second source/drain region 223 separated by a channel region 225, and (3) one or more gates(s), e.g., vertical access lines, 203-1, 203-2, . . . , 203-Q, opposing the channel region 225. In some embodiments, the channel region 225 may include silicon, germanium, silicon-germanium, and/or indium gallium zinc oxide (IGZO). In some embodiments, the first and the second source/drain regions, 221 and 223, can include an n-type dopant region, e.g., semiconductor material, formed adjacent to a p-type doped channel region, e.g., semiconductor material, of the access device to form an n-type conductivity transistor. In some embodiments, the first and the second source/drain regions, 221 and 223, may include a p-type conductivity, e.g., doped semiconductor material, formed adjacent to an n-type conductivity channel region, e.g., doped semiconductor material, of the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in the example of FIG. 2, the storage node 227, e.g., capacitor may be connected to the second source/drain region 223 of the access device. The second source/drain region 223 could equally be labeled and referred to herein as the first source/drain region. Again, the "first" and "second" source/drain labels only intend that they are separate and distinct, one connected to a digit line and the other to a storage node. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each horizontally oriented access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 207-1, 207-2, . . . , 207-P extend in the first direction (D1) 209, analogous to the first direction (D1) 109 in FIG. 1. The plurality of horizontally oriented digit lines 207-1, 207-2, . . . , 207-P may be analogous to the digit lines 107-1, 107-2, . . . , 107-P shown in FIG. 1. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), etc., and/or a metal-semiconductor compound, e.g., tungsten silicide, cobalt silicide, titanium silicide, etc. Embodiments, however, are not limited to these examples.

Among each of the vertical levels, 213-1 (L1), 213-2 (L2), and 213-P (L3), the horizontally oriented memory cells, e.g., memory cell 110 in FIG. 1, may be spaced apart from one another horizontally in the first direction (D1) 209. However, as described in more detail below in connection with FIG. 4 et. seq., the plurality of discrete components to the horizontally oriented access devices 230, e.g., first source/drain region 221 and second source/drain region 223 separated by a channel region 225, extending horizontally in the second direction (D2) 205, and the plurality of horizontally oriented digit lines 207-1, 207-2, . . . , 207-P extending horizontally in the first direction (D1) 209, may be formed within a same plane, e.g., level with, and in a same layer within each level. The plurality of horizontally oriented digit lines 207-1, 207-2, . . . , 207-P, extending in the first direction (D1) 209, may be in electrical contact with the first source/drain regions 221 and orthogonal to the horizontally oriented access devices 230, e.g., transistors, extending in horizontally in the second direction (D2) 205.

In some embodiments, the plurality of horizontally oriented digit lines 207-1, 207-2, . . . , 207-P, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel region 225, of the laterally oriented access device are formed. In some embodiments, the plurality of horizontally oriented digit lines 207-1, 207-2, . . . , 207-P, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the horizontally oriented, three-node access devices 230, e.g., transistors, extending laterally in the second direction (D2) 205, but adjacent to each other on a level, e.g., first level (L1), in the first direction (D1) 209. Each of the access lines, 203-1, 203-2, . . . , 203-Q, may vertically extend, in the third direction (D3), on sidewalls of respective ones of the plurality of horizontally oriented, three-node access devices 230, e.g., transistors, that are vertically stacked separated from a channel region by a gate dielectric.

For example, and as shown in more detail in FIG. 3, a first one of the vertically extending access lines, e.g., 203-1, may be adjacent a sidewall of a channel region 225 to a first one of the horizontally oriented, three-node access devices 230, e.g., transistors, in the first level (L1) 213-1, a sidewall of a channel region 225 of a first one of the horizontally oriented, three-node access devices 230, e.g., transistors, in the second level (L2) 213-2, and a sidewall of a channel region 225 a first one of the horizontally oriented, three-node access devices 230, e.g., transistors, in the third level (L3) 213-P, etc. Similarly, a second one of the vertically extending access lines, e.g., 203-2, may be adjacent a sidewall to a channel region 225 of a second one of the horizontally oriented, three-node access devices 230, e.g., transistors, in the first level (L1) 213-1, spaced apart from the first one of horizontally oriented, three-node access devices 230, e.g., transistors, in the first level (L1) 213-1 in the first direction (D1) 209. And the second one of the vertically extending access lines, e.g., 203-2, may be adjacent a sidewall of a channel region 225 of a second one of the horizontally oriented, three-node access devices 230, e.g., transistors, in the second level (L2) 213-2, and a sidewall of a channel region 225 of a second one of the horizontally oriented, three-node access devices 230, e.g., transistors, in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to access lines (AL), e.g., wordlines (WL), described in connection with FIG. 1.

As shown in the example embodiment of FIG. 2, an insulating layer dielectric (ILD) 250 may be formed extending in the first direction (D1) 209 along an end surface of the horizontally oriented, three-node access devices 230, e.g., transistors, in each level (L1) 213-1, (L2) 213-2, and (L3) 213-P above the substrate 200. The ILD 250 may isolate and separate the arrays of vertically stacked memory cells, e.g., 101-1, 101-2, . . . , 101-N in FIG. 1, along the second direction (D2) 205. The ILD 250 may include an insulating material, e.g., dielectric material, such as, for example, one of an oxide material, silicon oxide ($SiO_2$) material, silicon nitride (SiN) material, silicon oxynitride material, and/or combination thereof, etc.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the horizontally oriented, three-node access devices 330, e.g., transistors. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction. The first and the second source/drain regions, 321 and 323, may be analogous to the first and the second source/drain regions 221 and 223 shown in FIG. 2. The first and the second source/drain regions may be separated by a channel 325, e.g., channel region, of the horizontally oriented, three-node access devices 330, e.g., transistors. The channel may be a low-doped (p-) polysilicon material. However, in some embodiments the channel 325 may comprise a composite material such as an indium gallium zinc oxide ($In_2Ga_2ZnO_7$) material (also referred to herein as "IGZO"). In some embodiments, the channel 325 may include a multi-layer $In_2Ga_2ZnO_7$ channel that is indium (In) rich in a layer closest to a surface opposing a gate dielectric, relative to the multiple layers. In some embodiments, the channel 325 may include a multi-layer $I_2G_2ZnO_7$ channel that is gallium (Ga) rich in an outer layer, farthest from a surface opposing a gate dielectric, relative to the multiple layers. And, in some embodiments, the channel 325 may include a multi-layer $I_2G_2ZnO_7$ channel that is zinc (Zn) rich in an outer layer, farthest from a surface opposing a gate dielectric, relative to the multiple layers, etc. Embodiments, however, are not limited to these examples.

A digit line, e.g., 307-1, analogous to the digit lines 207-1, 207-2, . . . , 207-P in FIGS. 2 and 107-1, 107-2, . . . , 107-P shown in FIG. 1, may be formed in electrical contact with the first source/drain region 321. As shown in the example embodiment of FIG. 3, access lines, e.g., 303-1, analogous to the access lines 203-1, 203-2, . . . , 203-Q in FIGS. 2 and 103-1, 103-2, . . . , 103-Q in FIG. 1, may be vertically extending in the third direction (D3) 311 adjacent sidewall of the channel region 325 of the horizontally oriented, three-node access devices 330, e.g., transistors, horizontally conducting between the first and the second source/drain regions 321 and 323 along the second direction (D2) 305. A gate dielectric material 304 may be interposed between the access lines 303-1 (a portion thereof forming a gate to the horizontally oriented, three-node access devices 330, e.g., transistors) and the channel region 325. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
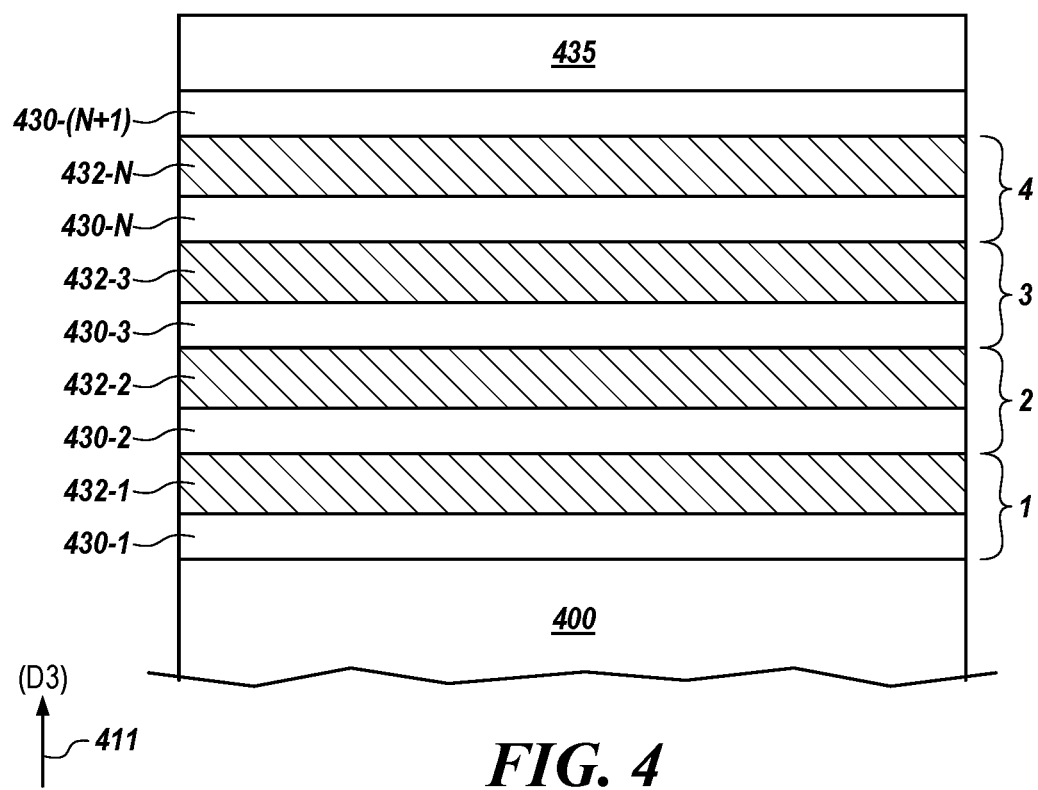
FIG. 4 illustrates an example method for forming arrays of vertically stacked memory cells, at one stage of a semiconductor fabrication process, to form three-node access devices in accordance with a number of embodiments of the present disclosure.

FIG. 4 illustrates an example method, at one stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. In the example embodiment shown in the example of FIG. 4, the method comprises depositing alternating layers of a dielectric material, 430-1, 430-2, . . . , 430-N, and a sacrificial semiconductor material, 432-1, 432-2, . . . , 432-N, in repeating iterations to form a vertical stack 401 on a working surface of a semiconductor substrate 400. As shown in FIG. 4, a vertical direction 411 is illustrated as a third direction (D3), e.g., z-direction in an x-y-z coordinate system, analogous to the third direction (D3), among first, second and third directions, shown in FIGS. 1-3. In the example of FIG. 4, four tiers, numbered 1, 2, 3, and 4, (also referred to in FIG. 2 as "levels") of the repeating iterations of the vertical stack 401 are shown. Embodiments, however, are not limited to this example and more or fewer repeating iterations may be included. A photolithographic hard mask (HM) layer 435 may be deposited as a top layer on the repeating iterations of the vertical stack 401.

In some embodiments, the dielectric material, 430-1, 430-2, . . . , 430-N, may be an interlayer dielectric (ILD). By way of example, and not by way of limitation, the dielectric material, 430-1, 430-2, . . . , 430-N, may comprise a silicon dioxide ($SiO_2$) material. In another example the dielectric material, 430-1, 430-2, . . . , 430-N, may comprise a silicon nitride ($Si_3N_4$) material (also referred to herein a "SiN"). In another example the dielectric material, 430-1, 430-2, . . . , 430-N, may comprise a silicon oxy-carbide (SiO$_x$C$_y$) material (also referred to herein as "SiOC"). In another example the dielectric material, 430-1, 430-2, . . . , 430-N, may include silicon oxy-nitride (SiO$_x$N$_y$) material (also referred to herein as "SiON"), and/or combinations thereof. Embodiments are not limited to these examples. In some embodiments the sacrificial semiconductor material, 432-1, 432-2, . . . , 432-N, may comprise a silicon (Si) material in a polycrystalline and/or amorphous state. In another example the sacrificial semiconductor material, 432-1, 432-2, . . . , 432-N, may comprise a silicon nitride (SiN) material. Embodiments, however, are not limited to these examples.

The repeating iterations of alternating dielectric material, 430-1, 430-2, . . . , 430-N, layers and sacrificial semiconductor material, 432-1, 432-2, . . . , 432-N, layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a dielectric material, 430-1, 430-2, . . . , 430-N, and a sacrificial semiconductor material, 432-1, 432-2, . . . , 432-N, in repeating iterations to form a vertical stack 401, as shown in FIG. 4.

Figure 5A:
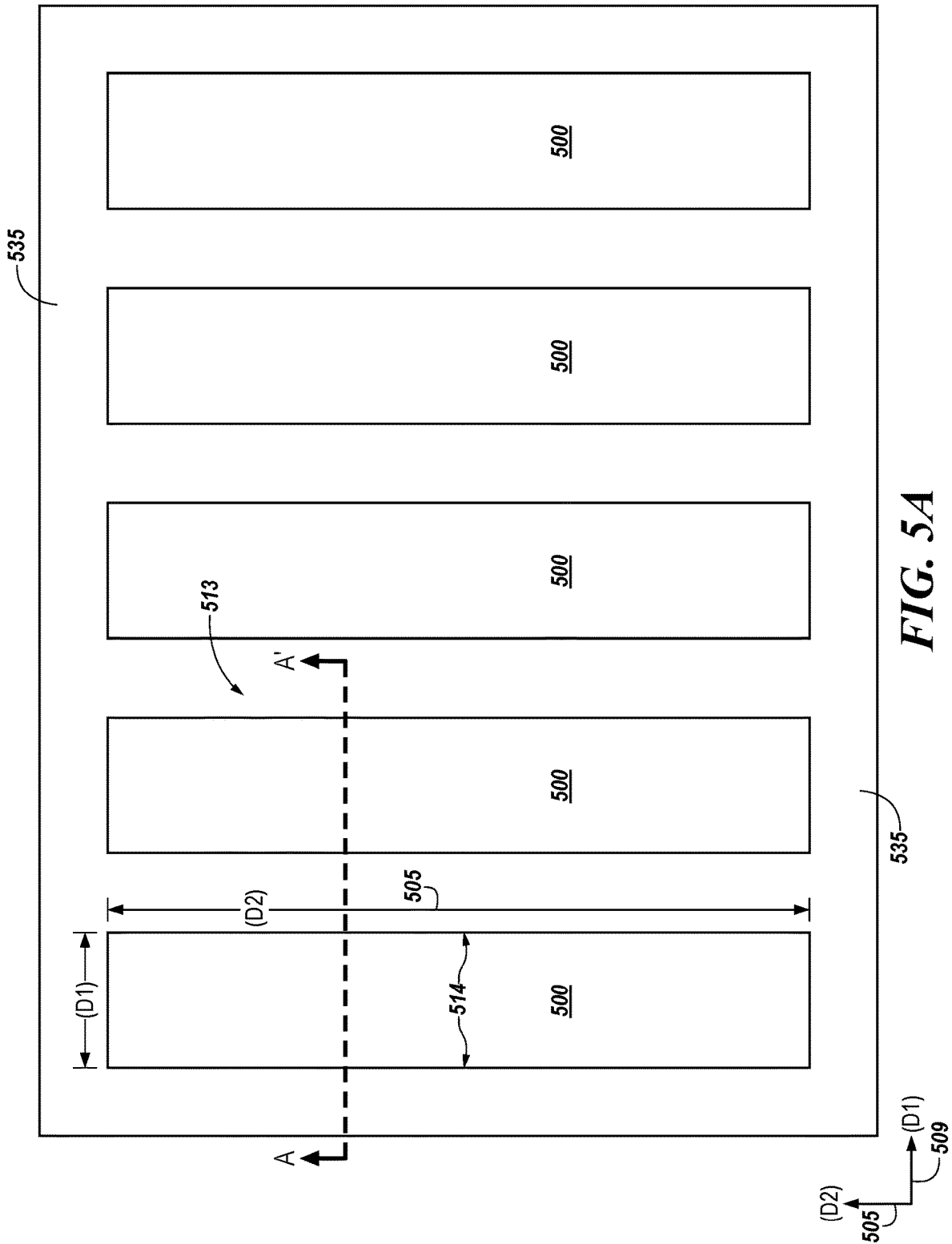

FIG. 5A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of access line formation vertical openings 500, having a first horizontal direction (D1) 509 and a second horizontal direction (D2) 505, through the vertical stack to the substrate. In one example, as shown in FIG. 5A, the plurality of access line vertical openings 500 are extending predominantly in the second horizontal direction (D2) 505 and may form elongated vertical, pillar columns 513 with sidewalls 514 in the vertical stack. The plurality of access line vertical openings 500 may be formed using photolithographic techniques to pattern a photolithographic mask 535, e.g., to form a hard mask (HM), on the vertical stack prior to etching the plurality of access line vertical openings 500.

FIG. 5B is a cross sectional view, taken along cut-line A-A' in FIG. 5A, showing another view of the semiconductor structure at a particular time in the semiconductor fabrication process. FIG. 5B illustrates that a conductive material, 528-1, 528-2, . . . , 528-4, may be formed on a sacrificial gate dielectric material 538 in the plurality of first vertical openings 500. By way of example and not by way of limitation, a sacrificial gate dielectric material 538 may be conformally deposited in the plurality of access line vertical openings 500 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The sacrificial gate dielectric 538 may be deposited to a particular thickness (t1) as suited to a particular design rule, e.g., a sacrificial gate dielectric thickness of approximately 10 nanometers (nm). Embodiments, however, are not limited to this example. By way of example, and not by way of limitation, the sacrificial gate dielectric 538 may comprise a silicon dioxide (SiO$_2$) material, aluminum oxide (Al2O3) material, high dielectric constant (k), e.g., high-k, dielectric material, and/or combinations thereof as also described in FIG. 3.

Further, as shown in FIG. 5B, a conductive material, 528-1, 528-2, . . . , 528-4, may be conformally deposited in the plurality of access line vertical openings 500 on a surface of the sacrificial gate dielectric material 538. By way of example, and not by way of limitation, the conductive material, 528-1, 528-2, . . . , 528-4, may be conformally deposited in the plurality of access line vertical openings 500 on a surface of the sacrificial gate dielectric material 538 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the sacrificial gate dielectric material 538. The sacrificial gate dielectric material 538 may be formed The conductive material, 528-1, 528-2, . . . , 528-4, may be conformally deposited to a particular thickness (t2) to form vertically oriented access lines, such as shown as access lines 103-1, 103-2, . . . , 103-Q (which also may be referred to a wordlines) shown in FIG. 1, et. seq., and as suited to a particular design rule. For example, the conductive material, 528-1, 528-2, . . . , 528-4, may be conformally deposited to a thickness of approximately 20 nanometers (nm). Embodiments, however, are not limited to this example. By way of example, and not by way of limitation, the conductive material, 528-1, 528-2, . . . , 528-4, may be comprise a metal such as tungsten (W), metal composition, titanium nitride (TiN), doped polysilicon, and/or some other combination thereof as also described in FIG. 3.

As shown in FIG. 5B, the conductive material, 528-1, 528-2, . . . , 528-4, may be recessed back to remain only along the vertical sidewalls of the elongated vertical, pillar columns, shown as 542-1, 542-2, and 542-3 in the cross-sectional view of FIG. 5B. The plurality of separate, vertical access lines formed from the conductive material, 528-1, 528-2, . . . , 528-4, may be recessed back by using a suitable selective, anisotropic, e.g., directional, etch process to remove the conductive material, 528-1, 528-2, . . . , 528-4, from a bottom surface of the first vertical openings, e.g., 500 in FIG. 5A, exposing the sacrificial gate dielectric material 538 on the bottom surface to form separate, vertical access lines, 528-1, 528-2, . . . , 528-4, now shown only remaining on the sidewalls 514. As shown in FIG. 5B, a dielectric material 539, such as an oxide or other suitable spin on dielectric (SOD), may then be deposited in the access line vertical openings 500, using a process such as CVD, to fill the access line vertical openings 500. The dielectric may be planarized to a top surface of the hard mask 535 of the vertical semiconductor stack, e.g., 401 as shown in FIG. 4, using chemical mechanical planarization (CMP) or other suitable semiconductor fabrication technique. A subsequent photolithographic material 536, e.g., hard mask, may be deposited using CVD and planarized using CM' to cover and close the first vertical openings 500 over the separate, vertical access lines, 528-1, 528-2, . . . , 528-4 remaining only on sidewalls 514 of the access line vertical openings 500. Similar semiconductor process techniques may be used at other points of the semiconductor fabrication process described herein.

Figure 6A:
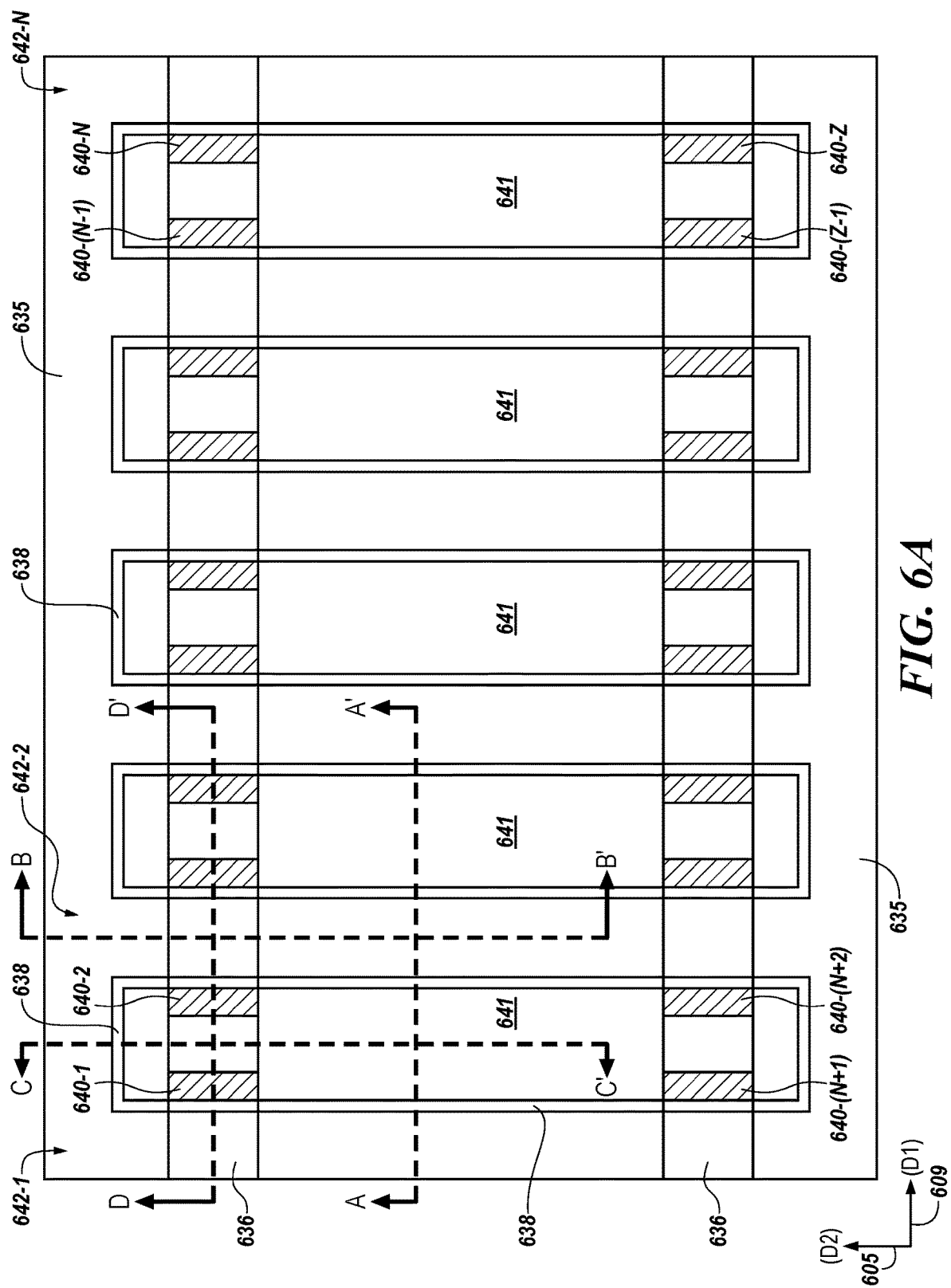

FIG. 6A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 6A illustrates a top down view of a semiconductor structure, at a particular point in time, in a semiconductor fabrication process, according to one or more embodiments. In the example embodiment of FIG. 6A, the method comprises using a photolithographic process to pattern the photolithographic mask 636, 536 in FIG. 5B. The method in FIG. 6A, further illustrates using a selective, isotropic (e.g., non-directional) etchant process remove portions of the exposed conductive material, 528-1, 528-2, . . . , 528-4 in FIG. 5B, to separate and individually form the plurality of separate, vertical access lines, 640-1, 640-2, . . . , 640-N, 640-(N+1), . . . , 640-(Z−1), and 640-Z, e.g., access lines 103-1, 103-2, . . . , 103-Q in FIG. 1, et. seq. Hence the plurality of separate, vertical access lines, 640-1, 640-2, . . . , 640-N, 640-(N+1), . . . , 640-(Z−1), and 640-Z, are shown along the sidewalls of the elongated vertical, pillar columns, e.g., along sidewalls of the elongated vertical, pillar columns 542-1, 542-2, and 542-3 in the cross-sectional view of FIG. 5B.

As shown in the example of FIG. 6A, the exposed conductive material, 528-1, 528-2, . . . , 528-4 in FIG. 5B, may be removed back to the sacrificial gate dielectric material 638 in the access line vertical openings, e.g., 500 in FIG. 5A, using a suitable selective, isotropic (e.g., non-directional) etch process. As shown in FIG. 6A, a subsequent dielectric material 641, such as an oxide or other suitable spin on dielectric (SOD), may then be deposited, using a process such as CVD, or other suitable technique, to fill the remaining openings from where the exposed conductive material, 528-1, 528-2, . . . , 528-4 in FIG. 5B, was removed. The dielectric material 641 may be planarized to a top surface of the previous hard mask 635 of the vertical semiconductor stack, e.g., 401 as shown in FIG. 4, using a process such as CMP, or other suitable technique. In some embodiments, a subsequent photolithographic material 537, e.g., hard mask, may be deposited using CVD and planarized using CM' to cover and close the plurality of separate, vertical access lines, 640-1, 640-2, . . . , 640-N, 640-(N+1), . . . , 640-(Z−1), and 640-Z, over a working surface of the vertical semiconductor stack, 401 in FIG. 4, leaving the plurality of separate, vertical access lines, 640-1, 640-2, . . . , 640-N, 640-(N+1), . . . , 640-(Z−1), and 640-Z, protected along the sidewalls of the elongated vertical, pillar columns, shown as 642-1, 642-2, and 642-3 in the cross-sectional view. Embodiments, however, are not limited to these process examples.

FIG. 6B illustrates a cross sectional view, taken along cut-line A-A' in FIG. 6A, showing another view of the semiconductor structure at this particular point in one example semiconductor fabrication process of an embodiment of the present disclosure. The cross sectional view shown in FIG. 6B is away from the plurality of separate, vertical access lines, 640-1, 640-2, . . . , 640-N, 640-(N+1), . . . , 640-(Z−1), and shows the repeating iterations of alternating layers of a dielectric material, 630-1, 630-2, . . . , 630-N, and a sacrificial semiconductor material, 632-1, 632-2, . . . , 632-N, on a semiconductor substrate 400 to form the vertical stack, e.g. 401 as shown in FIG. 4. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the example embodiment of FIG. 6B, the dielectric material 641 is shown filling the vertical openings on the residual sacrificial gate dielectric 638 deposition. The hard mask 637, described above, caps the illustrated structure.

FIG. 6C illustrates a cross sectional view, taken along cut-line B-B' in FIG. 6A, showing another view of the semiconductor structure at this particular point in one example semiconductor fabrication process of an embodiment of the present disclosure. The cross sectional view shown in FIG. 6C is illustrated extending in the second direction (D2) 605 along an axis of the repeating iterations of alternating layers of a dielectric material, 630-1, 630-2, . . . , 630-N, and a sacrificial semiconductor material, 632-1, 632-2, . . . , 632-N, along and in which the horizontally oriented access devices and horizontally oriented storage nodes, e.g., capacitor cells, can be formed within the layers of sacrificial semiconductor material, 632-1, 632-2, . . . , 632-N. In FIG. 6C, a neighboring, opposing vertical access line 640-3 is illustrated by a dashed line indicating a location set in from the plane and orientation of the drawing sheet.

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second direction (D2) 605 along an axis of the repeating iterations of alternating layers of a dielectric material, 630-1, 630-2, . . . , 630-N, and a sacrificial semiconductor material, 632-1, 632-2, . . . , 632-N, outside of a region in which the horizontally oriented access devices and horizontally oriented storage nodes, e.g., capacitor cells, will be formed within the layers of sacrificial semiconductor material, 632-1, 632-2, . . . , 632-N. In FIG. 6C, the dielectric material 641 is shown filling the space between the horizontally oriented access devices and horizontally oriented storage nodes, which can be spaced along a first direction (D1), extending into and out from the plane of the drawings sheet, for a three dimensional array of vertically oriented memory cells. At the left end of the drawing sheet is shown the repeating iterations of alternating layers of a dielectric material, 630-1, 630-2, . . . , 630-(N+1), and a sacrificial semiconductor material, 632-1, 632-2, . . . , 632-N, at which location a horizontally oriented digit line, e.g., digit lines 107-1, 107-2, . . . , 107-P shown in FIG. 1, et. seq., can be integrated to form electrical contact with the second source/drain regions or digit line conductive contact material, described in more detail below.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a dielectric material, 630-1, 630-2, . . . , 630-N, and a sacrificial semiconductor material, 632-1, 632-2, . . . , 632-N, intersecting across the plurality of separate, vertical access lines, 640-1, 640-2, . . . , 640-N, 640-(N+1), . . . , 640-(Z−1), and intersecting regions of the sacrificial semiconductor material, 632-1, 632-2, . . . , 632-N, in which a channel region may be formed, separated from the plurality of separate, vertical access lines, 640-1, 640-2, . . . , 640-N, 640-(N+1), . . . , 640-(Z−1), by the sacrificial gate dielectric material 638. In FIG. 6E, the dielectric fill material 639 is shown separating the space between neighboring horizontally oriented access devices and horizontally oriented storage nodes, which may be formed extending into and out from the plane of the drawing sheet as described in more detail below, and can be spaced along a first direction (D1) 609 and stacked vertically in arrays extending in the third direction (D3) 611 in the three dimensional (3D) memory.

Figure 7A:
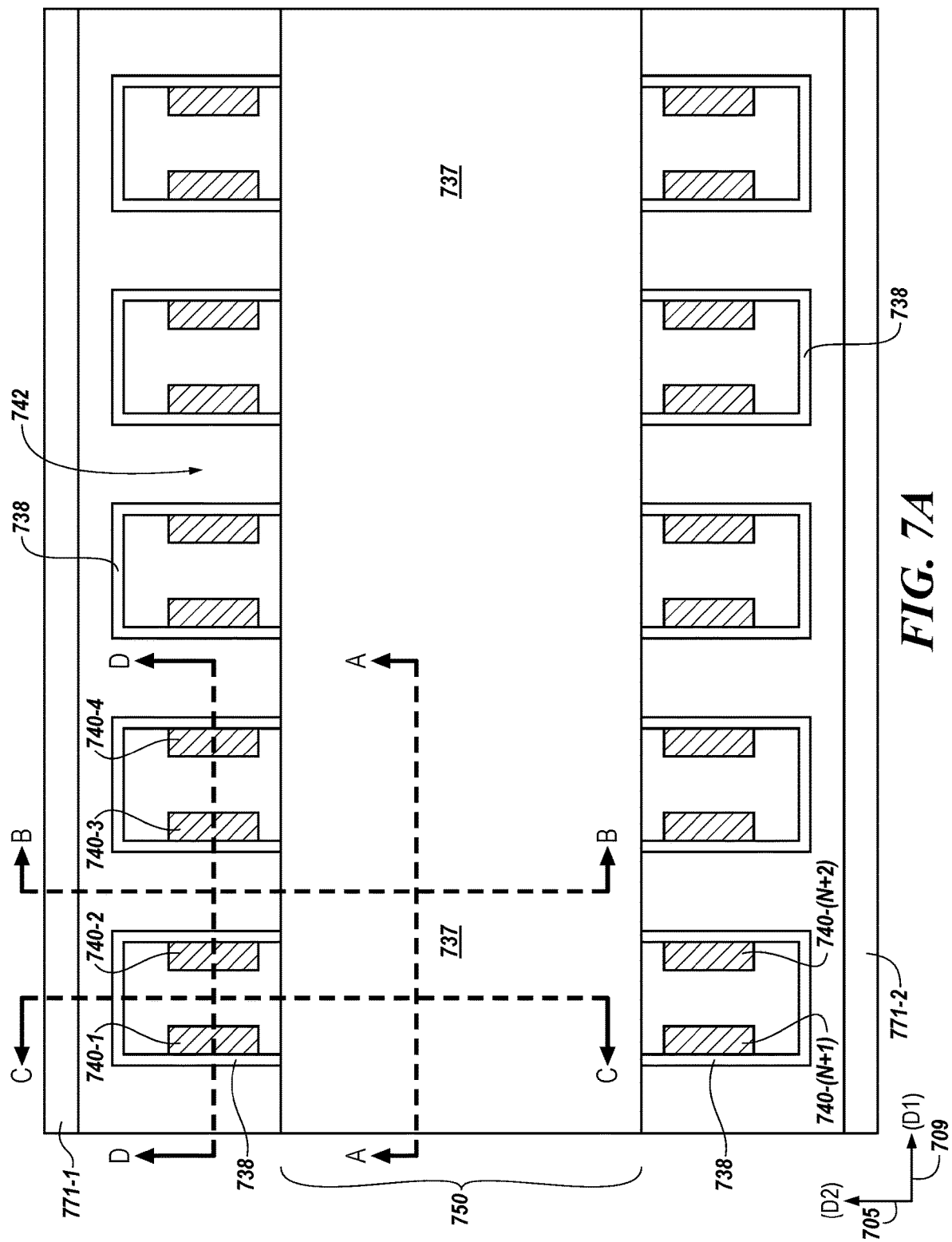

FIG. 7A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. In particular, FIGS. 7A-7K illustrate an example semiconductor fabrication process for a replacement gate dielectric. FIG. 7A illustrates a top down view of a semiconductor structure, at a particular point in time, in a semiconductor fabrication process, according to one or more embodiments. In the example embodiment of FIG. 7A, the method comprises using a photolithographic process to pattern the photolithographic masks 535 and/or 636, etc. as described in FIGS. 5 and 6. The method in FIG. 7A, further illustrates using one or more etchant processes to form a first vertical opening, 771-1 and 771-2, adjacent access device regions, e.g., 742 in FIGS. 7A and 7C, through the vertical stack. The first vertical openings 771-1 and 771-2 are illustrated extending predominantly in the first horizontal direction (D1) 709. The one or more etchant processes forms first vertical openings, 771-1 and 771-2, to expose first sidewalls in the repeating iterations of alternating layers of a dielectric material, 730-1, 730-2, . . . , 730-(N+1), and a sacrificial semiconductor material, 732-1, 732-2, . . . , 732-N, in the vertical stack, shown in FIGS. 7B-7E, adjacent a first region of the sacrificial semiconductor material. Other numerated components may be analogous to those shown and discussed in connection with FIGS. 5 and 6.

According to embodiments, an access device region 742 is shown in FIGS. 7A and 7C, e.g., transistor region, of the sacrificial semiconductor material, 732-1, 732-2, . . . , 732-N, may be removed from the repeating iterations of alternating layers of a dielectric material, 730-1, 730-2, . . . , 730-(N+1), and a sacrificial semiconductor material, 732-1, 732-2, . . . , 732-N, in the vertical stack to remove a sacrificial gate dielectric material 738 and deposit a replacement gate dielectric 760, and then later to form an access device, e.g. transistor as shown in FIGS. 8A-8E. A mask material 737 is shown protecting a storage node region 750. According to one embodiment the sacrificial semiconductor material, 732-1, 732-2, . . . , 732-N, is an oxide sacrificial semiconductor material (e.g., oxide semiconductor) such as polycrystalline and/or amorphous silicon dioxide (SiO$_2$). According to an example embodiments the method comprises selectively etching the access device region 742, e.g., first region, of the sacrificial semiconductor material, 732-1, 732-2, . . . , 732-N, to form a first horizontal opening 733 a first horizontal distance 751 (DIST1) back from first vertical openings, 771-1 and 771-2 in the vertical stack. One example of selectively etching the sacrificial semiconductor material, 732-1, 732-2, . . . , 732-N, comprises using an atomic layer etching (ALE) process. Other techniques may be used.

FIG. 7B illustrates a cross sectional view, taken along cut-line A-A' in FIG. 7A, showing another view of the semiconductor structure at this particular point in time in one example semiconductor fabrication process of an embodiment of the present disclosure. The cross sectional view shown in FIG. 7B is away from the plurality of separate, vertical access lines, 740-1, 740-2, . . . , 740-N, 740-(N+1), . . . , 740-(Z−1) in a storage node region, 750 in FIG. 7A, where storage node have not yet been formed, and shows repeating iterations of alternating layers of a dielectric material, 730-1, 730-2, . . . , 730-(N+1), and sacrificial semiconductor material, 732-1, 732-2, . . . , 732-N, e.g., sacrificial oxide semiconductor material separated by vertical isolation trenches having sacrificial gate dielectric material 738 lined walls and filed with isolation material such as spin on dielectric (SOD) 741 as explained in connection with FIGS. 6B and 6D. As shown in FIG. 7B, a vertical direction 711 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 709.

FIG. 7C illustrates a cross sectional view, taken along cut-line B-B' in FIG. 7A, showing another view of the semiconductor structure at a particular point in time after the sacrificial semiconductor material, 732-1, 732-2, . . . , 732-N, has been removed a first distance 751 (DIST 1) back from the vertical openings, e.g., 771-1 in FIG. 7A, to form horizontal openings, 733-1, 733-2, . . . , 733-N, in one example semiconductor fabrication process of an embodiment of the present disclosure. The cross sectional view shown in FIG. 7C is illustrated extending in the second direction (D2) 705, left and right along the plane of the drawing sheet, along an axis of the repeating iterations of alternating layers of a dielectric material, 730-1, 730-2, . . . , 730-(N+1). However, now it is shown in the drawing that the sacrificial semiconductor material has been removed in an access device region 742 of the alternating layers of the vertical stack to form horizontal openings, 733-1, 733-2, . . . , 733-N. As noted above, one example of selectively removing the sacrificial semiconductor material, 732-1, 732-2, . . . , 732-N, comprises using an atomic layer etching (ALE) process.

It is these horizontal openings, 733-1, 733-2, . . . , 733-N, in which the horizontally oriented access devices having a replacement gate dielectric 760, a first source/drain region, a channel region, and a second source/drain region can be formed between the vertical alternating layers of a dielectric material, 730-1, 730-2, . . . , 730-(N+1). But first, the sacrificial gate dielectric material 738 must be removed. As shown in FIG. 7C, the sacrificial gate dielectric material 738 may be seen from within the cross section of the openings, 733-1, 733-2, . . . , 733-N. The sacrificial gate dielectric material 738 is also shown in FIG. 7C with dashed lines behind the dielectric material 730-1, 730-2, . . . , 730-(N+1) as being set into the page of the drawing sheet, formed over the repeating iterations of alternating layers of dielectric material, 730-1, 730-2, . . . , 730-(N+1), and horizontal openings, 733-1, 733-2, . . . , 733-N. A neighboring vertical access line, e.g., 740 (also shown with dashed lines being set into the page) is adjacent the sacrificial gate dielectric material 738 where a replacement channel region will be formed. In the example embodiment of FIG. 7C, the horizontal openings 733-1, 733-2, . . . , 733-N, in which to form the replacement gate dielectric 760, shown in FIGS. 7I-7K, and horizontal access devices having a first source/drain region, channel region, and second source/drain region, are shown extending in second direction 705 (D2), left and right in the plane of the drawing sheet.

FIG. 7D illustrates a cross sectional view, taken along cut-line C-C' in FIG. 7A, showing another view of the semiconductor structure at this particular point in the example semiconductor fabrication process of an embodiment of the present disclosure. The cross sectional view shown in FIG. 7D is illustrated extending in the second direction (D2) 705, left and right in the plane of the drawing sheet, along an axis of the repeating iterations of alternating layers of a dielectric material, 730-1, 730-2, ..., 730-N, 730-(N+1) and horizontal openings 733-1, 733-2, ..., 733-N, outside of a region in which the horizontally oriented access devices and horizontally oriented storage nodes, e.g., capacitor cells, will be formed. In FIG. 7D, the dielectric fill material 739 is shown separating the space between neighboring opposing vertical access lines, e.g., 740-3 and alternating horizontal openings, 733-1, 733-2, ..., 733-N. In FIG. 7D, a neighboring, opposing vertical access line 740-3 is illustrated by a dashed line indicating a location set inward from the plane and orientation of the drawing sheet separated by a remaining wall of sacrificial gate dielectric 738, seen on an end of the dielectric fill material 739 in this cross sectional view, as deposited in access line trenches 500 in FIGS. 5 and 6. At the left end of the drawing sheet is shown the repeating iterations of alternating layers of a dielectric material, 730-1, 730-2, ..., 730-(N+1), and horizontal openings, 733-1, 733-2, ..., 733-N, at which location a horizontally oriented digit line, e.g., digit lines 107-1, 107-2, ..., 107-P shown in FIG. 1, et. seq., can be integrated to form electrical contact once the second source/drain regions of the horizontal access devices are formed.

FIG. 7E illustrates a cross sectional view, taken along cut-line D-D' in FIG. 7A, showing another view of the semiconductor structure at this particular point in time in one example semiconductor fabrication process of an embodiment of the present disclosure. The cross sectional view shown in FIG. 7E is illustrated, right to left in the plane of the drawing sheet, extending in the first direction (D1) 709 along an axis of the repeating iterations of alternating layers of a dielectric material, 730-1, 730-2, ..., 730-(N+1), and horizontal openings, 733-1, 733-2, ..., 733-N, in which channel regions will be formed separated from the plurality of separate, vertical access lines, 740-1, 740-2, ..., 740-4, by the original sacrificial gate dielectric 738. In FIG. 7E, the dielectric fill material 739 is shown separating the space between neighboring horizontally oriented access devices and horizontally oriented storage nodes, which may be formed extending into and out from the plane of the drawing sheet as described in more detail below, and can be spaced along a first direction (D1) 709 and stacked vertically in arrays extending in the third direction (D3) 711 in the three dimensional (3D) memory.

FIG. 7F illustrates a cross sectional view, taken along cut-line B-B' in FIG. 7A, showing another view of the semiconductor structure at this particular point after the sacrificial gate dielectric, 738 in earlier Figures, has been removed from the horizontal openings, 733-1, 733-2, ..., 733-N, in one example semiconductor fabrication process of an embodiment of the present disclosure. The cross sectional view shown in FIG. 7F is illustrated extending in the second direction (D2) 705, left and right along the plane of the drawing sheet, along an axis of the repeating iterations of alternating layers of a dielectric material, 730-1, 730-2, ..., 730-(N+1), and horizontal openings, 733-1, 733-2, ..., 733-N.

A portion of the sacrificial gate dielectric material 738 is seen formed over the center of repeating iterations of alternating layers of dielectric material, 730-1, 730-2, ..., 730-(N+1), and horizontal openings, 733-1, 733-2, ..., 733-N, with a neighboring vertical access line, e.g., 740-3, now exposed in the horizontal openings, 733-1, 733-2, ..., 733-N, due to the removal of the sacrificial gate dielectric material 738 that was shown in earlier Figures. The portion of the sacrificial gate dielectric material 738 that was removed may be etched away using a time exhume from the horizontal openings, 733-1, 733-2, ..., 733-N, but remains in other areas of the vertical access trenches, 500 in FIG. 5B, where the sacrificial semiconductor material, 732-1, 732-2, ..., 732-N, was not removed as shown by dashed line 738. The time exhumation may be used to selectively remove the sacrificial gate dielectric material 738. The time exhumation may be a polyphase exhumation. As such, a portion of the sacrificial gate dielectric material 738 may remain. The portion of the sacrificial gate dielectric material 738 remaining may provide structural stability for the access device.

FIG. 7G illustrates a cross sectional view, taken along cut-line C-C' in FIG. 7A, showing another view of the semiconductor structure at this particular point in one example semiconductor fabrication process of an embodiment of the present disclosure where the sacrificial gate dielectric 738 from earlier Figures has been removed. The cross sectional view shown in FIG. 7G is illustrated extending in the second direction (D2) 705, left and right in the plane of the drawing sheet, along an axis of the repeating iterations of alternating layers of a dielectric material, 730-1, 730-2, ..., 730-N, 730-(N+1) and horizontal openings 733-1, 733-2, ..., 733-N, outside of a region in which the horizontally oriented access devices and horizontally oriented storage nodes, e.g., capacitor cells, will be formed.

In FIG. 7G, the dielectric fill material 739 is shown separating the repeating iterations of alternating layers of a dielectric material, 730-1, 730-2, ..., 730-N, 730-(N+1) and horizontal openings 733-1, 733-2, ..., 733-N between where horizontal access devices will be formed. In FIG. 7G, only a portion of the sacrificial gate dielectric material, shown by dashed line 738 set into the page of the drawing sheet, remains in the center of the repeating iterations of alternating layers of a dielectric material, 730-1, 730-2, ..., 730-N, 730-(N+1) and horizontal openings 733-1, 733-2, ..., 733-N. The remaining portion of the sacrificial gate dielectric material 738 may not be seen in the cross sectional view shown in FIG. 7G because it is behind the dielectric fill material 739 in this cross sectional view.

FIG. 7H illustrates a cross sectional view, taken along cut-line D-D' in FIG. 7A, showing another view of the semiconductor structure at this particular point in time, after the sacrificial dielectric material 738 has been removed from in the earlier Figures, in one example semiconductor fabrication process of an embodiment of the present disclosure. The cross sectional view shown in FIG. 7H is illustrated, right to left in the plane of the drawing sheet, extending in the first direction (D1) 709 along an axis of the repeating iterations of alternating layers of a dielectric material, 730-1, 730-2, ..., 730-(N+1), and horizontal openings, 733-1, 733-2, ..., 733-N, in which a replacement gate dielectric, shown as 760 in FIGS. 7I-7K, and channel regions, shown in FIGS. 8A-8E, will be formed separated from the plurality of separate, vertical access lines, 740-1, 740-2, ..., 740-4. The dielectric fill material 739 is shown separating the space between neighboring horizontally oriented access devices and horizontally oriented storage nodes, which may be formed extending into and out from the plane of the drawing sheet as described in more detail below, and can be spaced along a first direction (D1) 709 and stacked vertically in arrays extending in the third direction (D3) 711 in the three dimensional (3D) memory. In FIG. 7H, only a portion of the sacrificial gate dielectric material 738 remains at the bottom of the vertical access trenches, 500 in FIG. 5B.

Figure 7I:
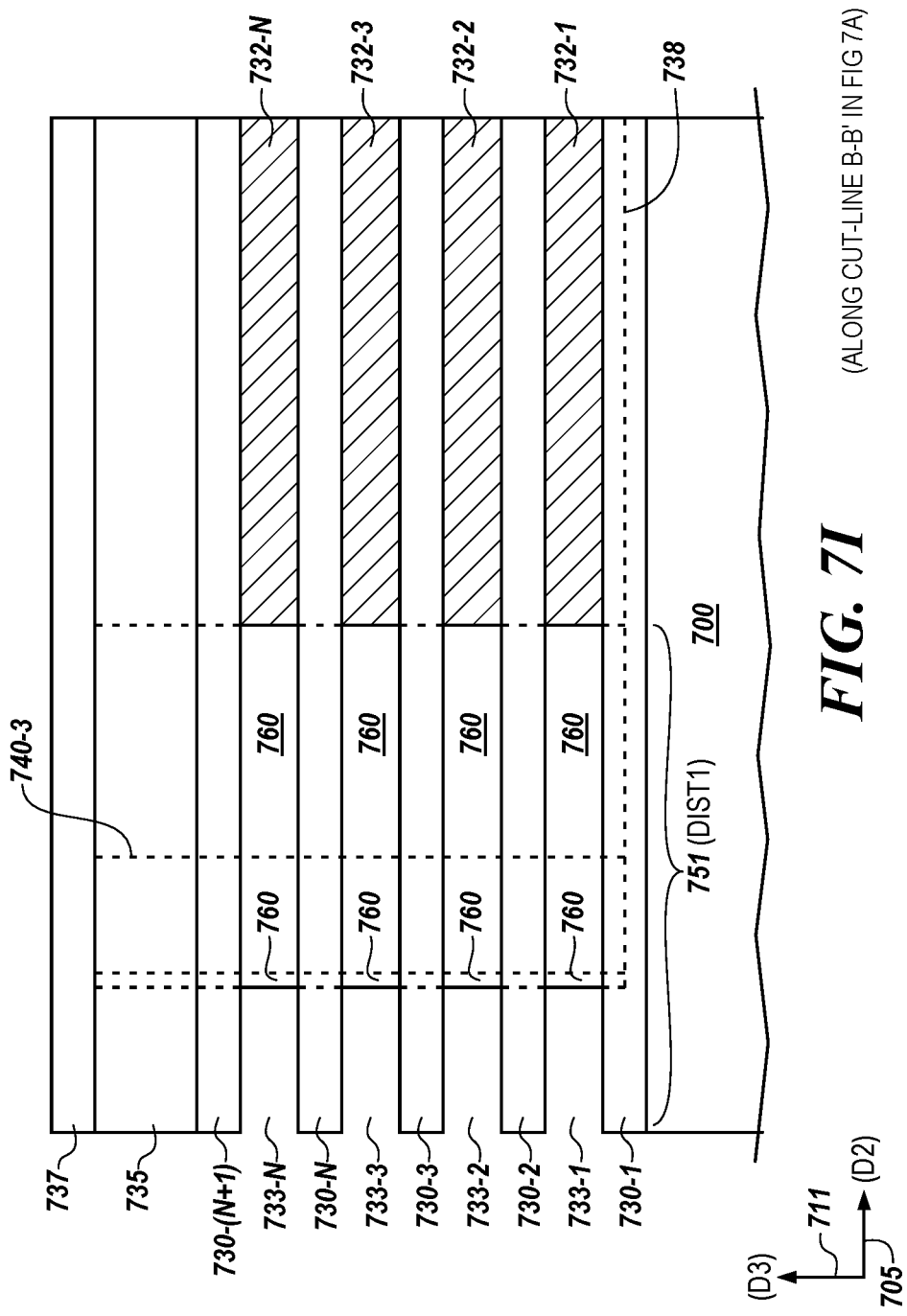

FIG. 7I illustrates a cross sectional view, taken along cut-line B-B' in FIG. 7A, showing another view of the semiconductor structure at a particular point where the replacement gate dielectric 760 has been deposited in one example semiconductor fabrication process of an embodiment of the present disclosure. The cross sectional view shown in FIG. 7I is illustrated extending in the second direction (D2) 705, left and right along the plane of the drawing sheet, along an axis of the repeating iterations of alternating layers of a dielectric material, 730-1, 730-2, . . . , 730-(N+1), and horizontal openings, 733-1, 733-2, . . . , 733-N. A portion of the remaining sacrificial gate dielectric material, as shown as dashed line 738 to the right of center in the drawing, will be behind the repeating iterations of alternating layers of dielectric material, 730-1, 730-2, . . . , 730-(N+1) and sacrificial semiconductor material, 732-1, 732-2, . . . , 732-N, where it has not been removed for the absence of access through horizontal openings, 733-1, 733-2, . . . , 733-N. A neighboring vertical access line, e.g., 740-3, as shown by dashed line is located behind the a new replacement gate dielectric material 760 deposited via the horizontal openings, 733-1, 733-2, . . . , 733-N.

As shown in FIG. 7I a replacement gate dielectric material 760 has been formed via the horizontal openings, 733-1, 733-2, . . . , 733-N, along the walls of the horizontal openings, 733-1, 733-2, . . . , 733-N, up against the vertical access line, e.g., 740-3, and/or dielectric fill material 739 (not shown) up until a distal end of the horizontal openings, 733-1, 733-2, . . . , 733-N, after which a portion of the sacrificial gate dielectric material 738 remains. The replacement gate dielectric material 760 may be formed using an atomic layer deposition (ALD) process. The replacement gate dielectric material 760 may be formed from a high dielectric constant (high-k) material. In some embodiments, a high-k material may be a material with a dielectric constant greater than or equal to nine (k≥9). In various embodiments, the replacement gate dielectric material 760 may be a high-k dielectric material and may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc. Embodiments are not limited to these examples. The replacement gate dielectric material 760 may be formed from a higher quality gate dielectric material, as in the examples above, and thus provides a better gate dielectric than the sacrificial gate dielectric material 738 which may be a much lower dielectric constant (low-k) dielectric material such as silicon dioxide ($SiO_2$). As such, the replacement gate dielectric material 760 may also be formed from to a thinner material thickness than the sacrificial gate dielectric material 738.

FIG. 7J illustrates a cross sectional view, taken along cut-line C-C' in FIG. 7A, showing another view of the semiconductor structure at this particular point in one example semiconductor fabrication process of an embodiment of the present disclosure with the replacement gate dielectric 760 having been deposited. The cross sectional view shown in FIG. 7J is illustrated extending in the second direction (D2) 705, left and right in the plane of the drawing sheet, along an axis of the repeating iterations of alternating layers of a dielectric material, 730-1, 730-2, . . . , 730-N, 730-(N+1) and horizontal openings 733-1, 733-2, . . . , 733-N, outside of a region in which the horizontally oriented access devices and horizontally oriented storage nodes, e.g., capacitor cells, will be formed.

In Figure the cross sectional view of FIG. 7J, the dielectric fill material 739 is shown adjacent the repeating iterations of alternating layers of a dielectric material, 730-1, 730-2, . . . , 730-N, 730-(N+1) and horizontal openings, 733-1, 733-2, . . . , 733-N, and the replacement gate dielectric material 760 is also shown at an end of the dielectric fill material 739 within the vertical access trenches, 500 in FIG. 5. The replacement gate dielectric material 760 is within the horizontal openings, 733-1, 733-2, . . . , 733-N, shown as dashed lines behind the dielectric fill material 739. It is the horizontal openings, 733-1, 733-2, . . . , 733-N, in which replacement source/drain material and replacement channel material will be deposited, as described in FIGS. 8A-8E. Again, the replacement gate dielectric material 760 is positioned between the dielectric fill material 739 and the repeating iterations of alternating layers of a dielectric material, 730-1, 730-2, . . . , 730-N, 730-(N+1) and within the horizontal openings 733-1, 733-2, . . . , 733-N.

FIG. 7K illustrates a cross sectional view, taken along cut-line D-D' in FIG. 7A, as a final view of the semiconductor structure at this particular point in time in one example semiconductor fabrication process of an embodiment of the present disclosure with the replacement gate dielectric material 760 having been deposited. The cross sectional view shown in FIG. 7K is illustrated, right to left in the plane of the drawing sheet, extending in the first direction (D1) 709 along an axis of the repeating iterations of alternating layers of a dielectric material, 730-1, 730-2, . . . , 730-(N+1), and horizontal openings, 733-1, 733-2, . . . , 733-N, from which the sacrificial dielectric 738 material has been removed and in which a replacement gate dielectric material 760 has been formed, and in which replacement channel material regions will be formed, as described in FIGS. 8A-8E. FIG. 7K shows the horizontal openings, 733-1, 733-2, . . . , 733-N, separated from the plurality of separate, vertical access lines, 740-1, 740-2, . . . , 740-4 by the replacement gate dielectric 760. The dielectric fill material 739 is shown separating neighboring horizontally oriented access devices. For example, the dielectric fill material 739 is shown separating the space between neighboring horizontally oriented access devices which may be formed extending into and out from the plane of the drawing sheet as described in more detail below, and which are be spaced along a first direction (D1) 709 and stacked vertically in arrays extending in the third direction (D3) 711 in the three dimensional (3D) memory. The replacement gate dielectric material 760 is shown positioned between the plurality of separate, vertical access lines, 740-1, 740-2, . . . , 740-4 and the repeating iterations of alternating layers of a dielectric material, 730-1, 730-2, . . . , 730-(N+1), and horizontal openings, 733-1, 733-2, . . . , 733-N.

Figure 8A:
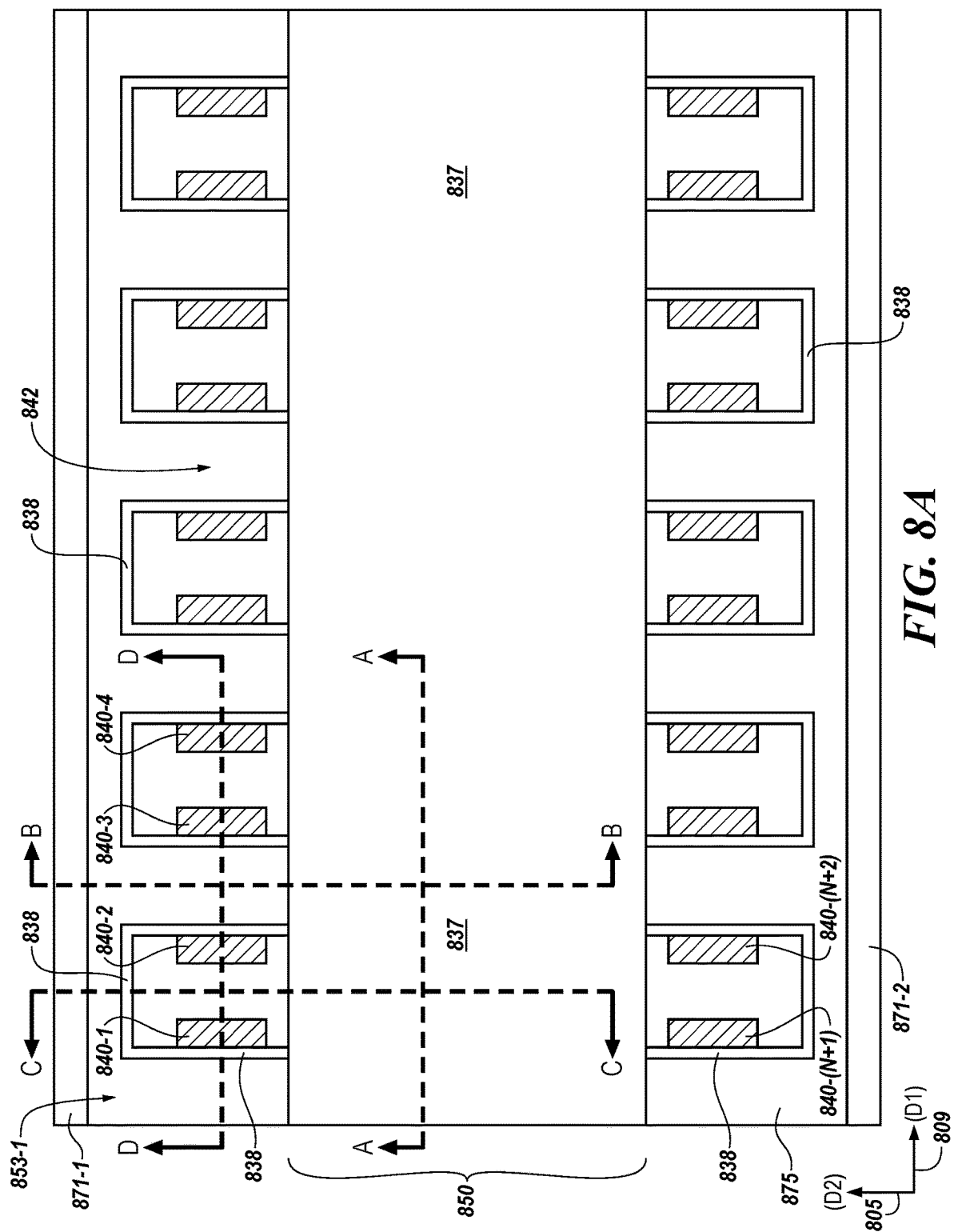

FIG. 8A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the vertical openings 871-1 and 871-2 remain present from FIG. 7A-7E. However, in FIGS. 8A-8E, horizontal access devices, 898-1, 898-2, . . . , 898-N, having first source/drain regions, channel regions, and second source/drain regions, shown respectively as 898-1A, 898-1B, and 898-1C, in FIG. 8C, have been formed in the horizontal openings, 733-1, 733-2, . . . , 733-N shown in FIGS. 7C and 7D. The horizontal access devices, 898-1, 898-2, 898-N, are formed extending in the second direction 805 (D2) in the horizontal access device regions 842 of the vertical stack. Additionally, horizontal digit lines, 899-1, 899-2, 899-N, have been formed and integrated in contact with the second source/drain regions, e.g., 898-1C, as shown in FIGS. 8C and 8D. Other numerated components may be analogous to those shown and discussed in connection with FIGS. 6, and 7.

According to embodiments, in the access device region 842, e.g., transistor region, the sacrificial semiconductor material, 632-1, 632-2, . . . , 632-N, in FIGS. 6A-6E, has been removed and replacement gate dielectric 860 has been formed, and the horizontal openings, 733-1, 733-2, . . . , 733-N, have been filled with horizontal access devices 898, e.g. transistors. According to embodiments, this process may be performed after selectively removing a storage node region 844 of the sacrificial semiconductor material in which to form a capacitor cell as described in FIGS. 9A-9E. According to an example embodiment, shown in FIGS. 8B-8E, the method comprises selectively depositing, using an atomic layer deposition (ALD) process, or other suitable deposition technique, a first source/drain region 838-1A, channel region 838-1B, and second source/drain region 838-1C in each of the horizontal openings, 733-1, 733-2, . . . , 733-N in FIGS. 7A-7E, after formation of the replacement gate dielectric, 760, in FIGS. 7I-7K and 860 in FIG. 8B. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region Other suitable semiconductor fabrication techniques and/or storage nodes structures may be used.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, . . . , 840-N, 840-(N+1), . . . , 840-(Z-1), and shows repeating iterations of alternating layers of a dielectric material, 830-1, 830-2, . . . , 830-(N+1), separated by a second region, 844 in FIG. 8C, of sacrificial semiconductor material, 832-1, 832-2, . . . , 832-N. As shown in FIG. 8B, a vertical direction 811 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 809.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a dielectric material, 830-1, 830-2, . . . , 830-(N+1).

However, now it is shown that the first source/drain region material, channel region material, and second source/drain region material, 898-1, 898-2, . . . , 898-N have been deposited in the horizontal openings, 733-1, 733-2, . . . , 733-N, in FIGS. 7A-7E, extending in the second direction 805 (D2). In one example, a first source/drain region 898-1, a channel region 898-1B, and 898-1C are illustrated distinctly. Further, horizontal digit line, 899-1, 899-2, . . . , 899-N, integration is achieved in contact with the second source/drain regions, e.g., 898-1C, extending in a first direction (D1), e.g., extending into and out from the plane of the drawing sheet in alternating layers vertically with the dielectric material, 830-1, 830-2, . . . , 830-(N+1) in direction (D3) 811. In one example, the horizontal digit line, 899-1, 899-2, . . . , 899-N, integration is achieved by filling the first vertical openings 871 with a suitable digit line conductive material such as tungsten (W) or highly doped semiconductor material, using a CVD process, and isotropically etching to recess the horizontal digit line, 899-1, 899-2, . . . , 899-N, into remaining portions of the horizontal openings, 733-1, 733-2, . . . , 733-N in FIG. 7, in electrical contact with the second source/drain regions, e.g., 898-1C. In another example, the horizontal digit line, 899-1, 899-2, . . . , 899-N, integration is achieved by using an atomic layer deposition (ALD) process to fill the remaining portions of the horizontal openings, 733-1, 733-2, . . . , 733-N in FIG. 7, and form electrical contact with the second source/drain regions, e.g., 898-1C.

Hence, three-node horizontal access devices, 838-1, 838-2, . . . , 838-N, have been formed and integrated to vertical access lines, 840-1, 840-2, . . . , 840-(Z+1) and integrated to digit lines, 899-1, 899-2, . . . , 899-N, without body contacts and with improved capacitor cell formation sequencing. Advantages to the structure and processes described herein can include a lower off-current (Ioff) for the access devices, as compared to non-replacement gate dielectrics in process flow of replacement source/drain and replacement channel three-node horizontal access devices. According to the techniques described herein, the channel region, e.g., 838-1B, may be free from minority carriers for the access devices and thus removing the need to control a body potential to a body region of the access device, and/or reduced gate/drain induced leakage (GIDL) for the access devices.

According to embodiments the gate dielectric material replacement fabrication steps may be performed after a capacitor cell formation process described in connection with FIGS. 9A-9E. Further, a digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process formation overhead.

The first source/drain region, the channel region, and the second source/drain region of the horizontal access devices, 898-1, 898-2, . . . , 898-N, and the horizontal digit line, 899-1, 899-2, . . . , 899-N, integration may be performed according to ALD processes and techniques. One example ALD process for forming first and second source/drain regions is disclosed in co-pending U.S. patent application Ser. No. 16/986,510, having at least one common inventor and titled "Source/Drain Integration in Three-Node Access Device for Vertical Three Dimensional (3D) Memory". Another example for channel region formation is disclosed in co-pending U.S. patent application Ser. No. 16/986,466, having at least one common inventor and titled "Channel Integration in Three-Node Access Device for Vertical Three Dimensional (3D) Memory". According to various embodiments, a further benefit is the avoidance, e.g., no use of, gas phase doping (GPD) in the formation of the source/drain regions. Other suitable semiconductor fabrication techniques and/or storage nodes structures may be used.

In the example embodiment of FIG. 8C, the horizontal access devices having a first source/drain region, channel region, and second source/drain region, 898-1, 898-2, . . . , 898-N, are shown extending in second direction 805 (D2), left and right in the plane of the drawing sheet, a first distance (D1) (751 in FIG. 7) from the first vertical openings 871-1 and 871-2 formed in the vertical stack and along an axis of orientation of the horizontal access devices and horizontal storage nodes of the arrays of vertically stacked memory cells of the three dimensional (3D) memory. As shown in FIG. 10, as dielectric material may be deposited to fill the vertical openings 871-1 and 871-3. In FIG. 8C, a neighboring, opposing vertical access line 840-3 is illustrated by a dashed line indicating a location set inward from the plane and orientation of the drawing sheet.

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a dielectric material, 830-1, 830-2, . . . , 830-N, 830-(N+1) and horizontal digit lines, 899-1, 899-2, . . . , 899-N, extending into and out from the plane of the drawing sheet in a first direction (D1), outside of a region in which the horizontally oriented access devices, 898-1, 898-2, . . . , 898-N, and horizontally oriented storage nodes, e.g., capacitor cells, in access device region 842 and storage node region 844 are formed. In FIG. 8D, the dielectric material 841 is shown filling the space between the horizontally oriented access devices, which can be spaced along a first direction (D1), extending into and out from the plane of the drawings sheet, for a three dimensional array of vertically oriented memory cells. At the left end of the drawing sheet is shown the repeating iterations of alternating layers of a dielectric material, 830-1, 830-2, . . . , 830-(N+1), and horizontal digit lines, 899-1, 899-2, . . . , 899-N, e.g., digit lines 107-1, 107-2, . . . , 107-P shown in FIG. 1, et. seq., integrated to form electrical contact with the second source/drain regions, e.g., 838-1A, or digit line conductive contact material, of the formed horizontal access devices.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a dielectric material, 830-1, 830-2, . . . , 830-(N+1), and channel regions of the horizontal access devices, 898-1, 898-2, . . . , 898-N, separated from the plurality of separate, vertical access lines, 840-1, 840-2, . . . , 840-4, by the replacement gate dielectric 860. In FIG. 8E, the dielectric fill material 839 is shown separating the space between neighboring horizontally oriented access devices and horizontally oriented storage nodes, which may be formed extending into and out from the plane of the drawing sheet as described in more detail below, and can be spaced along a first direction (D1) 809 and stacked vertically in arrays extending in the third direction (D3) 811 in the three dimensional (3D) memory.

Figure 9A:
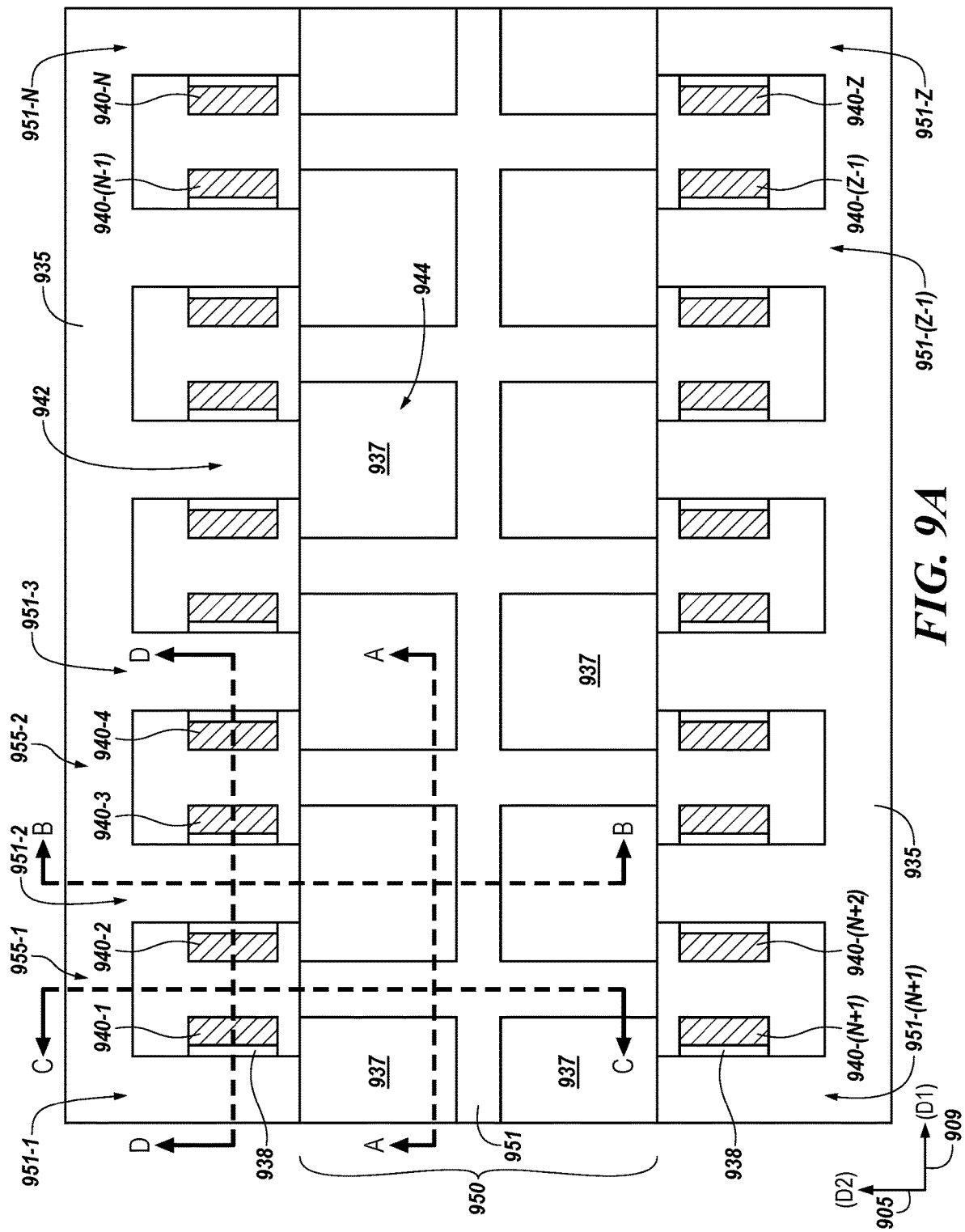

FIG. 9A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the method comprises using a photolithographic process to pattern the photolithographic masks 935, 936 and/or 937, e.g., 635, 636, and/or 637 in FIGS. 6A-6E. The method in FIG. 9A, further illustrates using one or more etchant processes to form a vertical opening 951 in a storage node region 950 (and 844 in FIGS. 8A and 8C) through the vertical stack and extending predominantly in the first horizontal direction (D1) 909. The one or more etchant processes forms a vertical opening 951 to expose second sidewalls in the repeating iterations of alternating layers of a dielectric material, 930-1, 930-2, . . . , 930-N, and a sacrificial semiconductor material, 932-1, 932-2, . . . , 932-N, in the vertical stack, shown in FIGS. 9B-9E, adjacent a second region of the sacrificial semiconductor material. Other numerated components may be analogous to those shown and discussed in connection with FIG. 6, or earlier Figures.

According to embodiments, a second region 944 of the sacrificial semiconductor material, 932-1, 932-2, . . . , 932-N, may be removed from the repeating iterations of alternating layers of a dielectric material, 930-1, 930-2, . . . , 930-N, and a sacrificial semiconductor material, 932-1, 932-2, . . . , 932-N, in the vertical stack to form a storage node. According to embodiments, this process is performed after selectively removing an access device region of the sacrificial semiconductor material in which to form a first source/drain region, channel region, and second source/drain region of the horizontally oriented access devices. According to embodiments, selectively etching the second region 944 can include performing an atomic layer etching (ALE) process selective to the sacrificial semiconductor material, 932-1, 932-2, . . . , 932-N, in the second region 944.

According to an example embodiment, shown in FIGS. 9B-9E, the method comprises selectively etching the second region 944 of the sacrificial semiconductor material, 932-1, 932-2, . . . , 932-N, to form a second horizontal opening a second horizontal distance 957 (D2 opening) back from a vertical opening 951 in the vertical stack. In some embodiments, as shown in FIGS. 9B-9E, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 961 and a second electrode 956 separated by a cell dielectric 963. Other suitable semiconductor fabrication techniques and/or storage nodes structures may be used.

FIG. 9B illustrates a cross sectional view, taken along cut-line A-A' in FIG. 9A, showing another view of the semiconductor structure at this particular point in one example semiconductor fabrication process of an embodiment of the present disclosure. The cross sectional view shown in FIG. 9B is away from the plurality of separate, vertical access lines, 940-1, 940-2, . . . , 940-N, 940-(N+1), . . . , 940-(Z−1), and shows repeating iterations of alternating layers of a dielectric material, 930-1, 930-2, . . . , 930-(N+1), separated by horizontally oriented capacitor cells having first electrodes 961, e.g., bottom cell contact electrodes, cell dielectrics 963, and second electrodes 956, e.g., top, common node electrodes, on a semiconductor substrate 900 to form the vertical stack. As shown in FIG. 9B, a vertical direction 911 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 909. In the example embodiment of FIG. 9B, the first electrodes 961, e.g., bottom electrodes, are in direct electrical, ohmic contact with source/drain regions of horizontal access devices (using the same as an etch stop in the formation process), and second electrodes 956 are illustrated separated by a cell dielectric material 963 extending into and out of the plane of the drawing sheet in second direction (D2) and along an axis of orientation of the horizontal access devices and horizontal storage nodes of the arrays of vertically stacked memory cells of the three dimensional (3D) memory.

The first and second electrodes may be formed of any suitable conductive material such as doped polysilicon, metal, e.g., titanium (Ti), tungsten (W), etc., and/or conductive metal composition, e.g., titanium nitride (TiN), tantalum nitride (TaN), etc. Embodiments are not limited to these examples. In various embodiments, the cell dielectric material 963 can be a high-k dielectric material and may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc. Embodiments are not limited to these examples.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second direction (D2) 905, left and right along the plane of the drawing sheet, along an axis of the repeating iterations of alternating layers of a dielectric material, 930-1, 930-2, ... , 930-(N+1), the horizontally oriented access devices 998 and integrally formed digit lines 999 in region 942, and the subsequently formed storage nodes, e.g., capacitor cells, formed in region 944. In the example embodiment of FIG. 9C, the horizontally oriented storage nodes, e.g., capacitor cells, are illustrated as having been formed been formed in this semiconductor fabrication process and first electrodes 961, e.g., bottom electrodes to be coupled to source/drain regions of horizontal access devices, and second electrodes 956, e.g., top electrodes to be coupled to a common electrode plane such as a ground plane, separated by cell dielectrics 963, are shown. According to embodiments, the first electrodes 961, e.g., bottom electrodes to be coupled to source/drain regions of horizontal access devices, and second electrodes 956, e.g., top electrodes to be coupled to a common electrode plane such as a ground plane, separated by cell dielectrics 963, are formed subsequent to forming a first source/drain region, a channel region, and a second source/drain region in a region of the horizontally oriented access devices 998.

In the example embodiment of FIG. 9C, the horizontally oriented storage nodes having the first electrodes 961, e.g., bottom electrodes to be coupled to source/drain regions of horizontal access devices, and second electrodes 956, e.g., top electrodes to be coupled to a common electrode plane such as a ground plane, are shown formed in a second horizontal opening extending in second direction (D2), left and right in the plane of the drawing sheet, a second distance 957 (D2 opening) from the vertical opening 951 formed in the vertical stack and along an axis of orientation of the horizontal access devices and horizontal storage nodes of the arrays of vertically stacked memory cells of the three dimensional (3D) memory. In FIG. 9C, a neighboring, opposing vertical access line 940-3 is illustrated by a dashed line indicating a location set inward from the plane and orientation of the drawing sheet.

FIG. 9D illustrates a cross sectional view, taken along cut-line C-C' in FIG. 9A, showing another view of the semiconductor structure at this particular point in one example semiconductor fabrication process of an embodiment of the present disclosure. The cross sectional view shown in FIG. 9D is illustrated extending in the second direction (D2) 905, left and right in the plane of the drawing sheet, along an axis of the repeating iterations of alternating layers of a dielectric material, 930-1, 930-2, ... , 930-N, 930-(N+1) and a sacrificial semiconductor material, 932-1, 932-2, ... , 932-N, outside of a region in which the horizontally oriented access devices and horizontally oriented storage nodes, e.g., capacitor cells, are formed. In FIG. 9C, the dielectric material 941 is shown filling the space between the horizontally oriented access devices, which can be spaced horizontally along a first direction (D1), extending into and out from the plane of the drawings sheet, for a three dimensional array of vertically oriented memory cells. In the cross sectional view of FIG. 9D, the second electrode 956, e.g., top, common electrode to the a capacitor cell structure, is additionally shown present in the space between horizontally neighboring devices. At the left end of the drawing sheet is shown the repeating iterations of alternating layers of a dielectric material, 930-1, 930-2, ... , 930-(N+1), and the integrally formed horizontally oriented digit lines 999 extending into and out from the plane of the drawing sheet, and connected to a source/drain region of the horizontally oriented access devices.

FIG. 9E illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9E is illustrated, right to left in the plane of the drawing sheet, extending in the first direction (D1) 909 along an axis of the repeating iterations of alternating layers of a dielectric material, 930-1, 930-2, ... , 930-(N+1), and a channel region, e.g., 998-1B in FIG. 9C, of the horizontally oriented access devices 998, extending in to and out from a plane of the drawing sheet, and intersecting across the plurality of separate, vertical access lines, 940-1, 940-2, ... , 940-4 separated from the channel regions by the gate dielectric 938. In FIG. 9E, the dielectric fill material 939 is shown separating the space between neighboring horizontally oriented access devices and horizontally oriented storage nodes, which may be formed extending into and out from the plane of the drawing sheet and can be spaced along a first direction (D1) 909 and stacked vertically in arrays extending in the third direction (D3) 911 in the three dimensional (3D) memory.

FIG. 10 illustrates a three-node horizontally oriented access device 1042 coupled to a horizontally oriented storage node 1044 for vertical three dimensional (3D) memory, according to embodiments of the present disclosures. In FIG. 10, the three-node horizontally oriented access device 1042 is illustrated extending in a second direction (D2) 1005, left and right in the plane of the drawing sheet. The horizontally oriented access device 1042 is illustrated having a first source/drain region 1098-1A in electrical contact with a first electrode 1061, e.g., bottom electrode, of the horizontally oriented storage node 1044, e.g., capacitor cell. The storage node 1044 is further illustrated with a dielectric material 1063 separating the first electrode 1061 from a second electrode 1056, e.g., top, common node electrode of the capacitor cell.

A channel region 1098-1B is illustrated in electrical contact with the first source/drain region 1098-1A. A vertically oriented access line 1040-3 opposes the channel region 1098-1B and is separated therefrom by a gate dielectric. The vertically oriented access line 1040-2 is illustrated by dashed lines indicating that the vertically oriented access line is set into and/or out from the plane of the drawing sheet. The vertically oriented access line 1040 may extend longer and/or shorter than the channel region in the second direction (D2) 1005, e.g., having source/drain overlap and/or underlap, according to particular design rules.

A second source/drain region 1098-1C is illustrated in electrical contact with the channel region 1098-1B and in electrical contact with and integrated to a horizontally oriented digit line 1099 extending into and out from a plane of the drawing sheet. As shown in FIG. 10, the horizontally oriented access device 1042 and horizontally oriented storage node 1044 may be spaced horizontally from neighboring memory cells by an interlayer dielectric material 1080 along the second direction (D2) 1005 and may be spaced vertically from stacked, neighboring cells in a three dimensional (3D) memory by dielectric layers 1030-1 and 1030-2.

Figure 11:
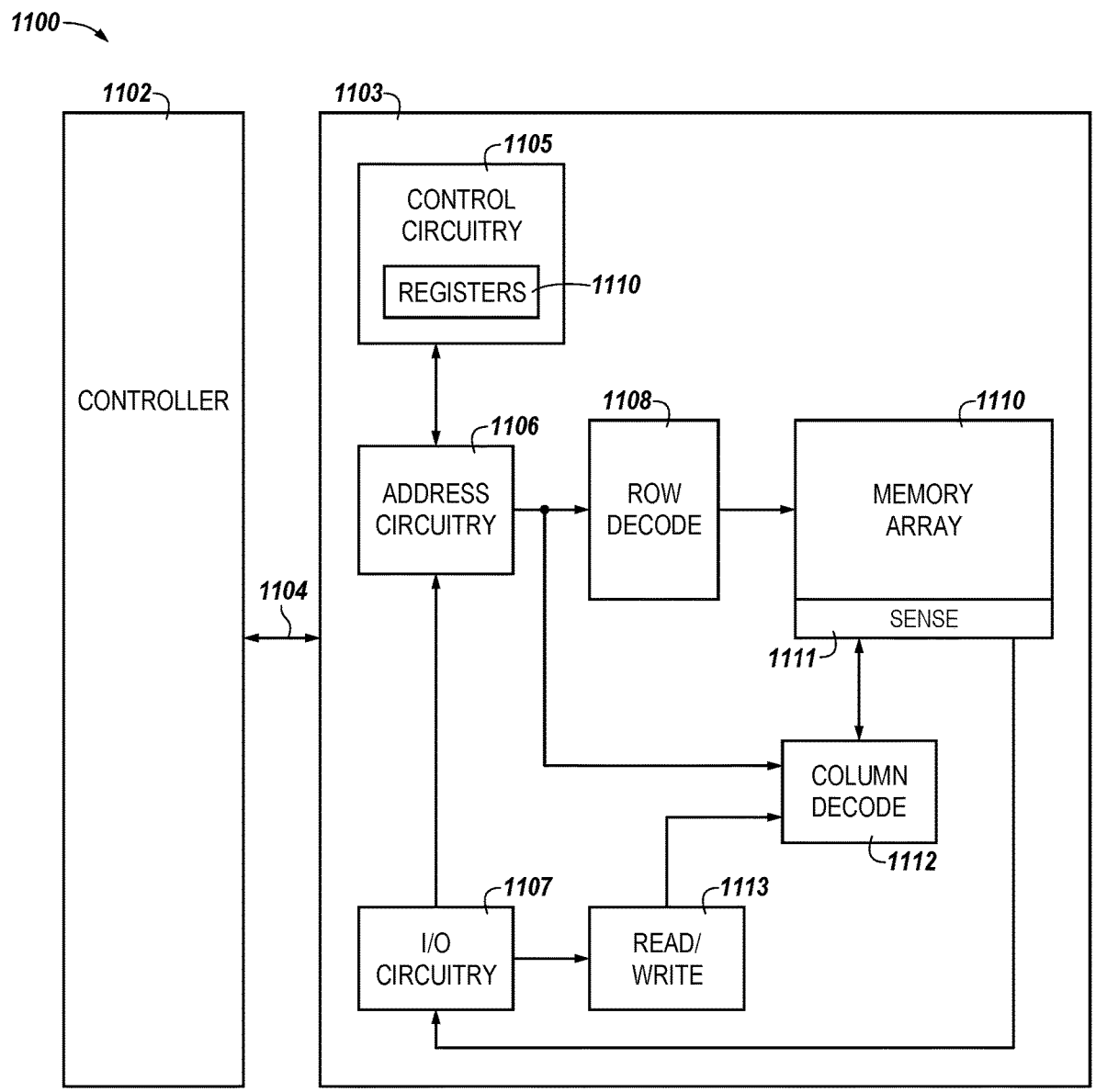
FIG. 11 is a block diagram of an apparatus in the form of a computing system including a memory device in accordance with a number of embodiments of the present disclosure.

FIG. 11 is a block diagram of an apparatus in the form of a computing system 1100 including a memory device 1103 in accordance with a number of embodiments of the present disclosure. As used herein, a memory device 1103, a memory array 1110, and/or a host 1102, for example, might also be separately considered an "apparatus." According to embodiments, the memory device 1102 may comprise at least one memory array 1110 having a three-node access device for vertical three dimensional (3D) memory, as has been described herein.

In this example, system 1100 includes a host 1102 coupled to memory device 103 via an interface 1104. The computing system 1100 can be a personal laptop computer, a desktop computer, a digital camera, a mobile telephone, a memory card reader, or an Internet-of-Things (IoT) enabled device, among various other types of systems. Host 1102 can include a number of processing resources (e.g., one or more processors, microprocessors, or some other type of controlling circuitry) capable of accessing memory 1103. The system 1100 can include separate integrated circuits, or both the host 1102 and the memory device 1103 can be on the same integrated circuit. For example, the host 1102 may be a system controller of a memory system comprising multiple memory devices 1103, with the system controller 1105 providing access to the respective memory devices 1103 by another processing resource such as a central processing unit (CPU).

In the example shown in FIG. 1, the host 1102 is responsible for executing an operating system (OS) and/or various applications (e.g., processes) that can be loaded thereto (e.g., from memory device 1103 via controller 1105). The OS and/or various applications can be loaded from the memory device 1103 by providing access commands from the host 1102 to the memory device 1103 to access the data comprising the OS and/or the various applications. The host 1102 can also access data utilized by the OS and/or various applications by providing access commands to the memory device 1103 to retrieve said data utilized in the execution of the OS and/or the various applications.

For clarity, the system 1100 has been simplified to focus on features with particular relevance to the present disclosure. The memory array 1110 can be a DRAM array, SRAM array, STT RAM array, PCRAM array, TRAM array, RRAM array, NAND flash array, and/or NOR flash array, comprising at least one three-node access device for three dimension (3D) memory. For example, the memory array 1110 can be an unshielded DL 4F2 array such as a 3D-DRAM memory array. The array 1110 can comprise memory cells arranged in rows coupled by word lines (which may be referred to herein as access lines or select lines) and columns coupled by digit lines (which may be referred to herein as sense lines or data lines). Although a single array 1110 is shown in FIG. 1, embodiments are not so limited. For instance, memory device 1103 may include a number of arrays 1110 (e.g., a number of banks of DRAM cells).

The memory device 1103 includes address circuitry 1106 to latch address signals provided over an interface 1104. The interface can include, for example, a physical interface employing a suitable protocol (e.g., a data bus, an address bus, and a command bus, or a combined data/address/command bus). Such protocol may be custom or proprietary, or the interface 1104 may employ a standardized protocol, such as Peripheral Component Interconnect Express (PCIe), Gen-Z, CCIX, or the like. Address signals are received and decoded by a row decoder 1108 and a column decoder 1112 to access the memory array 1110. Data can be read from memory array 1110 by sensing voltage and/or current changes on the sense lines using sensing circuitry 111. The sensing circuitry 1111 can comprise, for example, sense amplifiers that can read and latch a page (e.g., row) of data from the memory array 1110. The I/O circuitry 1107 can be used for bi-directional data communication with the host 1102 over the interface 1104. The read/write circuitry 1113 is used to write data to the memory array 1110 or read data from the memory array 1110. As an example, the circuitry 1113 can comprise various drivers, latch circuitry, etc.

Control circuitry 1105 decodes signals provided by the host 1102. The signals can be commands provided by the host 1102. These signals can include chip enable signals, write enable signals, and address latch signals that are used to control operations performed on the memory array 1110, including data read operations, data write operations, and data erase operations. In various embodiments, the control circuitry 1105 is responsible for executing instructions from the host 1102. The control circuitry 1105 can comprise a state machine, a sequencer, and/or some other type of control circuitry, which may be implemented in the form of hardware, firmware, or software, or any combination of the three. In some examples, the host 1102 can be a controller external to the memory device 103. For example, the host 1102 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and vertically oriented access lines, comprising:
    depositing alternating layers of a dielectric material and a sacrificial material to form a vertical stack;
    using a first etchant process to form a plurality of first vertical openings, having a first horizontal direction and a second horizontal direction, through the vertical stack to the substrate and extending predominantly in the second horizontal direction to form elongated vertical, pillar columns with sidewalls in the vertical stack;
    conformally depositing first conductive material on a sacrificial gate dielectric material in the first vertical openings to form a plurality of separate, vertical access lines along the sidewalls of the elongated vertical, pillar columns;
    using a second etchant process to form a second vertical opening through the vertical stack and extending predominantly in the first horizontal direction to expose second sidewalls of the vertical stack adjacent a first region of the sacrificial material;
    selectively removing the first region to form a first horizontal opening;
    selectively removing a portion of the sacrificial gate dielectric material accessible from the first horizontal opening;
    depositing a replacement gate dielectric material where the sacrificial gate dielectric material was removed; and
    depositing a first source/drain material, a channel material, a second source/drain material sequentially to form a horizontally oriented access device.

2. The method of claim 1, further comprising depositing a high dielectric constant (high-k) material as the replacement gate dielectric material.

3. The method of claim 2, further comprising depositing a high dielectric constant (high-k) material with a dielectric constant greater than nine (k≥9) as the replacement gate dielectric material.

4. The method of claim 1, further comprising depositing silicon dioxide ($SiO_2$) as the sacrificial gate dielectric material.

5. The method of claim 1, further comprising performing a polyphase exhumation to selectively remove the portion of the sacrificial gate dielectric material.

6. The method of claim 5, further comprising performing a time exhumation selectively remove the portion of the sacrificial gate dielectric material.

7. The method of claim 1, further comprising selectively removing a portion of the sacrificial gate dielectric material to provide structural stability to the access line.

8. The method of claim 1, further comprising using a third etchant process to form a third vertical opening through the vertical stack and extending predominantly in the first horizontal direction to expose third sidewalls in the vertical stack adjacent a second region of the sacrificial semiconductor material.

9. The method of claim 1, further comprising selectively etching a portion of the sacrificial material to form a storage node of the memory cell before depositing the source/drain material.

10. The method of claim 1, further comprising:
    depositing a polysilicon (poly-Si) material as the sacrificial material; and
    depositing a silicon nitride (SiN) material as the dielectric material.

11. A method for forming memory arrays having vertically stacked memory cells and having laterally oriented access devices with vertically oriented access lines, comprising:
    depositing layers of a first dielectric material and a sacrificial material, in repeating iterations vertically to form a vertical stack;

patterning and etching the vertical stack to form a first vertical opening through the vertically repeating layers;

depositing a conductive material, via the first vertical opening, onto the surface of a sacrificial gate dielectric material;

etching the vertical stack to form a second vertical opening to expose sidewalls of the vertical stack extending in a first horizontal direction;

etching the vertical stack through the first horizontal direction to form a first horizontal opening;

etching a portion of the sacrificial gate dielectric material through the first horizontal direction leaving another portion of the sacrificial gate dielectric material to maintain a structure of the vertical stack;

depositing a replacement gate dielectric material with a high dielectric constant (high-k) material; and forming the first source/drain material on a top surface of the sacrificial material.

12. The method of claim 11, further comprising depositing the replacement gate dielectric material using an atomic layer deposition (ALD) process.

13. The method of claim 11, further comprising forming the replacement gate dielectric material from a material thinner than the sacrificial gate dielectric material.

14. The method of claim 11, further comprising depositing an oxide material as the sacrificial gate dielectric material.

15. The method of claim 11, further comprising forming the replacement gate dielectric material from a hafnium oxide material, a hafnium silicon oxide material, a lanthanum oxide material, or combinations thereof.

16. The method of claim 11, further comprising forming the replacement gate dielectric material from a zirconium oxide material, a zirconium silicon oxide material, an aluminum oxide material, or combinations thereof.

17. A method for forming memory arrays having vertically stacked memory cells and having laterally oriented access devices with vertically oriented access lines, comprising:

depositing layers of a first dielectric material and a sacrificial semiconductor material, in repeating iterations vertically to form a vertical stack;

forming a first vertical opening through the vertical stack and extending predominantly in the first horizontal direction to expose first sidewalls adjacent a first region of the sacrificial semiconductor material;

sequentially forming a conductive material, via the first vertical opening, onto the surface of a sacrificial gate dielectric material;

forming a second vertical opening through the vertical stack and extending predominantly in the first horizontal direction to expose second sidewalls of the vertical stack adjacent a second region of the sacrificial semiconductor material;

selectively removing the first region to form a first horizontal opening in the sacrificial semiconductor material;

removing a portion of the sacrificial gate dielectric material through the first horizontal direction;

using an atomic layer deposition (ALD) process to deposit a replacement gate dielectric material with a high dielectric constant (high-k) material;

forming a source/drain material, a channel material and a second source/drain material sequentially in the first horizontal opening to form a horizontally oriented three-node access device; and forming a second horizontal opening in the vertical stack in which to form a storage node electrically coupled to the source/drain material after formation of the three-node access device in the first region.

18. The method of claim 17, further comprising forming the replacement gate dielectric material from a sturdier material than the sacrificial gate dielectric material.

19. The method of claim 17, further comprising:

integrating a horizontally oriented digit line around a fill material to form electrical contact with the digit line conductive contact material; and integrating a vertically oriented access line opposing the channel material separated therefrom by a gate dielectric to form the three node access device.

20. The method of claim 17, further comprising forming the channel region from one of silicon, germanium, silicon-germanium, and/or indium gallium zinc oxide material.

\* \* \* \* \*